United States Patent [19]

Lemelson

[11] Patent Number: 5,570,992
[45] Date of Patent: *Nov. 5, 1996

[54] FREE-TRAVELING MANIPULATOR WITH OPTICAL FEEDBACK CONTROL AND METHODS

[76] Inventor: Jerome H. Lemelson, Ste. 286, Unit 802 930 Tahoe Blvd., Incline Village, Nev. 89451-9436

[*] Notice: The term of this patent shall not extend beyond the expiration date of Pat. No. 5,017,084.

[21] Appl. No.: 480,114

[22] Filed: Jun. 7, 1995

Related U.S. Application Data

[63] Continuation of Ser. No. 899,353, Jun. 15, 1992, which is a continuation of Ser. No. 621,341, Dec. 3, 1990, abandoned, which is a division of Ser. No. 249,404, Sep. 23, 1988, Pat. No. 5,017,084, which is a continuation-in-part of Ser. No. 251,656, Apr. 6, 1981, abandoned, and a division of Ser. No. 941,554, Dec. 11, 1986, Pat. No. 4,773,815, which is a continuation of Ser. No. 639,301, Aug. 9, 1984, abandoned, which is a continuation-in-part of Ser. No. 200,347, Oct. 24, 1980, abandoned, which is a continuation of Ser. No. 910,998, May 30, 1978, abandoned, which is a continuation of Ser. No. 753,321, Dec. 20, 1976, abandoned, which is a continuation of Ser. No. 544,832, Jan. 29, 1975, abandoned, which is a continuation-in-part of Ser. No. 436,073, Jan. 24, 1974, abandoned, said Ser. No. 251,656, is a continuation of Ser. No. 91,908, Nov. 6, 1979, abandoned, which is a continuation of Ser. No. 107,357, Jan. 18, 1971, abandoned, which is a continuation-in-part of Ser. No. 858,560, Aug. 29, 1969, Pat. No. 3,854,889, Ser. No. 712,443, Mar. 12, 1968, Pat. No. 3,559,256, and Ser. No. 717,065, Mar. 12, 1968, Pat. No. 3,559,257, said Ser. No. 858,560, is a continuation of Ser. No. 629,758, Apr. 10, 1967, abandoned, which is a continuation-in-part of Ser. No. 465,812, Apr. 8, 1965, Pat. No. 3,313,014, which is a continuation-in-part of Ser. No. 152,702, Oct. 17, 1961, abandoned, which is a division of Ser. No. 449,874, Jul. 28, 1954, abandoned, said Ser. No. 712,443, and Ser. No. 717,065, each is a continuation-in-part of Ser. No. 387,954, Aug. 6, 1964, Pat. No. 3,372,568, which is a continuation-in-part of Ser. No. 219,357, Aug. 13, 1962, abandoned, which is a continuation-in-part of Ser. No. 557,415, Apr. 10, 1956, Pat. No. 3,049,247, which is a continuation-in-part of Ser. No. 477,467, Dec. 24, 1954, abandoned, and Ser. No. 449,874.

[51] Int. Cl.⁶ ............................................ B66C 23/00
[52] U.S. Cl. ............................ 414/744.3; 901/1; 901/9; 901/32; 901/41
[58] Field of Search ......................... 414/4, 730, 244.3, 414/244.6, 244.8; 901/1, 9, 17, 22, 28, 29, 32, 41

[56] References Cited

U.S. PATENT DOCUMENTS

| Re. 25,956 | 2/1966 | Williamson | 90/11 |
| Re. 26,770 | 1/1970 | Lemelson | 29/33 |
| Re. 26,904 | 6/1970 | Lemelson | 214/1 |
| 3,049,247 | 8/1962 | Lemelson | 214/16.4 |

(List continued on next page.)

FOREIGN PATENT DOCUMENTS

| 902069 | 7/1962 | United Kingdom . |
| 929352 | 6/1963 | United Kingdom . |

OTHER PUBLICATIONS

Proceedings of the Tenth Conference on Hot Laboratories and Equipment, By American Nuclear Society, 1962.
"Punched–Tape Units Control New Type Transfer Line", *Iron Age*, pp. 106–108 (Mar. 20, 1958).

(List continued on next page.)

*Primary Examiner*—Joseph E. Valenza
*Attorney, Agent, or Firm*—Louis J. Hoffman

[57] ABSTRACT

An automatic, controlled manipulator includes a moveable tool head on an arm and a tool supported at the end of the arm. The manipulator may be moveable in multiple or all directions. A storage for remotely generated control signals can be accessed to control motors causing 3D motion of the tool head, attachment of the tool, and (if applicable) motion of the manipulator, and also to control power to operate the tool. Video signals generated at the manipulator are used to identify the workpiece, to select one of a plurality of stored control programs, and to select the tool operations applied.

34 Claims, 5 Drawing Sheets

U.S. PATENT DOCUMENTS

| | | | |
|---|---|---|---|
| 3,119,501 | 1/1964 | Lemleson | 214/16.4 |
| 3,154,979 | 11/1964 | Crispin | 29/33 P X |
| 3,202,449 | 8/1965 | Lemelson | 294/88 |
| 3,227,012 | 1/1966 | Lemelson | 77/65 |
| 3,227,290 | 1/1966 | Lemelson | 214/1 |
| 3,229,656 | 1/1966 | Bodey | 114/5 |
| 3,247,978 | 4/1966 | Neumeier | 214/1 |
| 3,259,958 | 7/1966 | Lemelson | 29/26 |
| 3,272,347 | 9/1966 | Lemelson | 214/1 |
| 3,285,437 | 11/1966 | Lemelson | 214/16.4 |
| 3,313,014 | 4/1967 | Lemelson | 29/33 |
| 3,346,894 | 10/1967 | Lemelson | 10/128 |
| 3,372,568 | 3/1968 | Lemelson | 72/218 |
| 3,387,723 | 6/1968 | Lemelson | 214/16.4 |
| 3,389,814 | 6/1968 | Lemelson | 214/16.4 |
| 3,451,224 | 6/1969 | Colechia et al. | 61/69 |
| 3,474,919 | 10/1969 | Lemelson | 214/16.4 |
| 3,486,640 | 12/1969 | Lemelson | 214/16.4 |
| 3,497,088 | 2/1970 | Lemelson | 214/16.4 |
| 3,513,993 | 5/1970 | Lemelson | 214/16.4 |
| 3,519,148 | 7/1970 | Lemelson | 214/16.4 |
| 3,519,151 | 7/1970 | Lemelson | 214/16.4 |
| 3,520,424 | 7/1970 | Lemelson | 214/16.4 |
| 3,543,392 | 12/1970 | Perry et al. | 29/563 |
| 3,543,947 | 12/1970 | Devol | 214/1 |
| 3,559,256 | 2/1971 | Lemelson | 29/33 |
| 3,559,257 | 2/1971 | Lemelson | 29/33 |
| 3,576,540 | 4/1971 | Fair et al. | 340/172.5 |
| 3,712,481 | 1/1973 | Harwood | 214/1 CM |
| 3,759,563 | 9/1973 | Kitamura | 294/88 |
| 3,760,956 | 9/1973 | Burch | 214/1 BB |
| 3,804,270 | 4/1974 | Michaur et al. | 214/16 B |
| 3,809,182 | 5/1974 | Wilson | 182/148 |
| 3,854,889 | 12/1974 | Lemelson | 29/33 P |
| 4,046,262 | 9/1977 | Vykukal et al. | 214/1 CM |
| 4,369,563 | 1/1983 | Williamson et al. | 29/568 |
| 4,621,410 | 11/1986 | Williamson | 29/568 |
| 4,636,137 | 1/1987 | Lemelson | 414/730 |
| 4,773,815 | 9/1988 | Lemelson | 414/744 A |
| 5,017,084 | 5/1991 | Lemelson | 414/744.3 |

OTHER PUBLICATIONS

"News Report... First US Tape–Controlled Line Goes into Production at Hughes–El Segundo," *American Machinist*, p. 98 (Mar. 24, 1958).

Wagenseil, "The Line that Made Headlines," *American Machinist*, pp. 106–109 (May 5, 1958).

Wagenseil, "America's First Tape–Controlled Production Line," *Metalworking Production*, pp. 1639–1642 (Jun. 13, 1958).

Williamson, "Next Step for NC, Integrated Manufacturing Control," *Control Engineering*, pp. 66–74 (Sep. 1967).

Williamson, "New Wavé in Manufacturing," *American Machinist*, pp. 143–154 (Sep. 11, 1967).

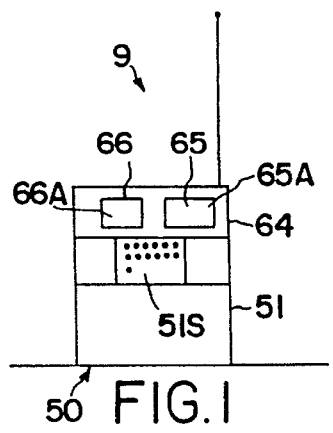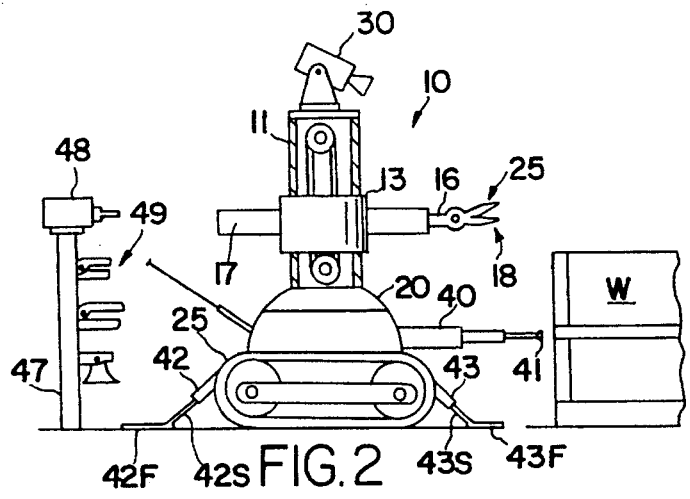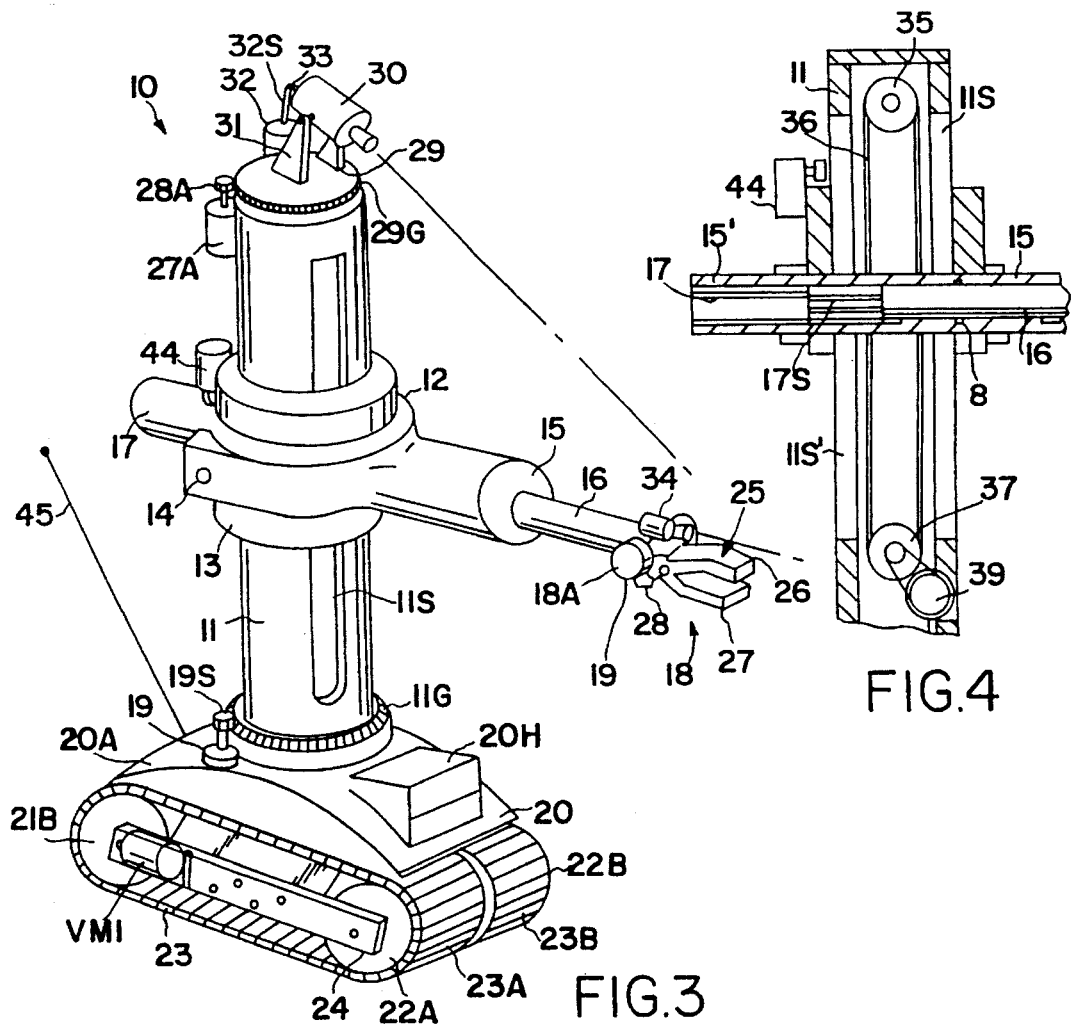

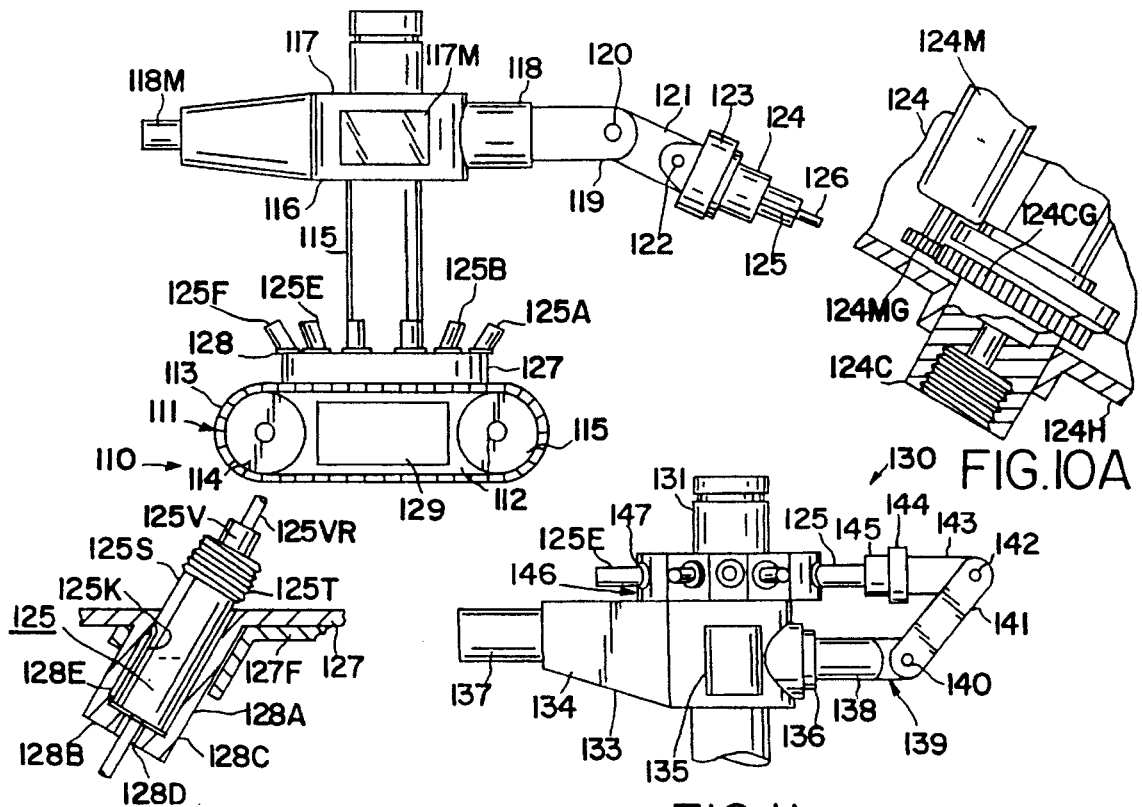
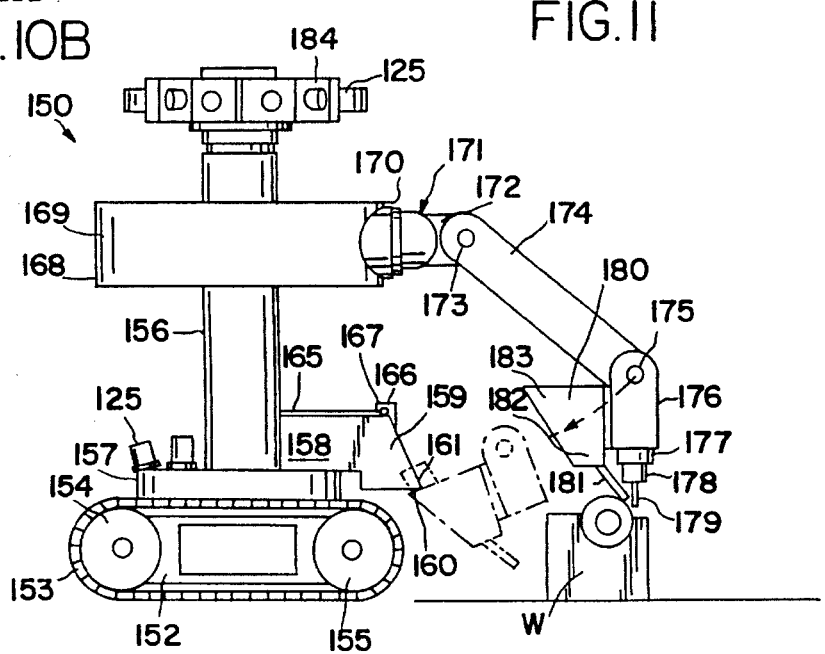

FREE-TRAVELING MANIPULATOR WITH OPTICAL FEEDBACK CONTROL AND METHODS

RELATED APPLICATIONS

This application is a continuation of U.S. patent application Ser. No. 899,353, filed Jun. 15, 1992, pending, which is a continuation of U.S. patent application Ser. No. 621,341, filed Dec. 3, 1990, abandoned, which is a division of U.S. patent application Ser. No. 249,404, filed Sep. 23, 1988, now U.S. Pat. No. 5,017,084, which is:

1) a continuation-in-part of U.S. patent application Ser. No. 251,656, filed Apr. 6, 1981, now abandoned, which is a continuation of U.S. patent application Ser. No. 091,908, filed Nov. 6, 1979, now abandoned, which is a continuation of U.S. patent application Ser. No. 107,357, filed Jan. 18, 1971, now abandoned, which is a continuation-in-part of:

a) U.S. patent application Ser. No. 858,560 filed Aug. 29, 1969, now U.S. Pat. No. 3,854,889, which is a continuation of U.S. patent application Ser. No. 629,758 filed Apr. 10, 1967, now abandoned, which is a continuation-in-part of U.S. patent application Ser. No. 465,812 filed Apr. 8, 1965, now U.S. Pat. No. 3,313,014, which is a continuation-in-part of U.S. patent application Ser. No. 152,702 filed Oct. 17, 1961, now abandoned, which is a divisional of U.S. patent application Ser. No. 449,874 filed Jul. 28, 1954, now abandoned, and b) each of the U.S. patent application Ser. Nos. 712,443 filed Mar. 12, 1968, now U.S. Pat. No. 3,559,256, and U.S. patent application Ser. No. 717,065 filed Mar. 12, 1968, now U.S. Pat. No. 3,559,257; each of said U.S. patent application Ser. Nos. 712,443 and 717,065 being a continuation-in-part of U.S. patent application Ser. No. 387,954 filed Aug. 6, 1964, now U.S. Pat. No. 3,372,568, which is a continuation-in-part of U.S. patent application Ser. No. 219,357 filed Aug. 13, 1962, now abandoned, which is a continuation-in-part of U.S. patent application Ser. No. 557,415 filed Apr. 10, 1956, now U.S. Pat. No. 3,049,247, which is a continuation-in-part of the U.S. patent applications Ser. No. 477,467 filed Dec. 24, 1954, now abandoned, and U.S. patent application Ser. No. 449,874 filed Jul. 28, 1954, now abandoned;

2) and a division of U.S. patent application Ser. No. 941,554, filed Dec. 11, 1986, now U.S. Pat. No. 4,773,815, which is a continuation of U.S. patent application Ser. No. 639,301, filed Aug. 9, 1984, now abandoned, which is a continuation-in-part of U.S. patent application Ser. No. 200,347, filed Oct. 24, 1980, now abandoned, which is a continuation of U.S. patent application Ser. No. 910,998, filed May 30, 1978, now abandoned, which is a continuation of U.S. patent application Ser. No. 753,321, filed Dec. 20, 1976, now abandoned, which is a continuation of U.S. patent application Ser. No. 544,832, filed Jan. 29, 1975, now abandoned, which is a continuation-in-part of U.S. patent application Ser. No. 436,073, filed Jan. 24, 1974, now abandoned.

SUMMARY OF THE INVENTION

This invention relates to an automatic manipulator and in particular to a computer or program controlled manipulator for performing a variety of different operations on work in process with different tools and/or work holding fixtures wherein an operating head of the manipulator is adapted to removably retain selected of a plurality of different tools and may self-change same in an automatic manner.

In one form, a plurality of tools, which may comprise tools for forming, cutting, assembling, inspecting, cleaning, spraying, welding or otherwise operating on work, are supported by the manipulator and the manipulator has an arm assembly which is movable to permit its operative head at the end of such assembly to be aligned with a selected tool location of a fixture supported by the manipulator.

The manipulator is operable to effect the exchange of one tool which it holds for a second tool on the fixture by one of a number of means including moving the manipulator head to a storage location of the fixture and disposing or depositing the tool it holds at such storage location by releasing same, after which the manipulator is operated to dispose its tool holding fixture in alignment with a selected second tool and to operate thereafter to seize and retain such second tool in a predetermined manner on its fixture to permit it to be operated thereafter when the fixture is moved by the manipulator with respect to work in process.

In another form, a plurality of tools are disposed on a fixture which is rotatable on and supported by the manipulator and which is selectively rotated to bring a selected tool thereof into alignment with the fixture supported at the end of the manipulator arm assembly to permit the tool to be seized or otherwise disposed on the manipulator operating head to be used in performing operations with respect to work when the manipulator is automatically operated thereafter.

Transfer of the tool held by the manipulator head to a selected location of the tool storage fixture is effected by selectively locating the storage fixture to bring a selected storage location thereof into alignment with the manipulator operating head after which the tool held by the head is released to and secured on the storage fixture.

In yet another form of the invention, a plurality of tools and handling devices are supported at respective storage locations of a rack supported above the ground or floor on which the manipulator operates wherein the manipulator is automatically and/or remotely controlled to align itself with such rack and along its operating head with a selected storage location of the rack to dispose and release the tool the manipulator head is carrying at such select storage location so as to permit the head of the manipulator to receive and hold another tool at another location of the rack. Thereafter, the manipulator is automatically or remotely controlled to align its operating head with a second select location of the rack and to move and operate to cause the tool at such second location to be transferred to its head and to become operatively attached thereto so that the manipulator may operate thereafter or handle work with such tool. Such rack may be stationary or contain one or more movable fixtures, such as rotary turrets for a plurality of tools and handling devices for work to be handled or operated on by said manipulator.

Accordingly it is a primary object of this invention to provide a new and improved automatic manipulator for handling and manipulating a plurality of tools and/or articles of manufacture.

Another object is to provide an automatic manipulator which may be operated to automatically perform a variety of different operating functions on work using different tools to perform such functions.

Another object is to provide an automatic manipulator which may be automatically operated to perform selected machining, assembly and handling functions with respect to work.

Another object is to provide an automatic programmable tool and work handling manipulator which may automatically perform many different operations on work using different tools, such as machining, spraying, inspection and measuring and handling functions without the need for manual attendance or tool changing to be performed by a human being.

Another object is to provide an automatic manipulator supporting a plurality of different tools and/or handling devices and a control system for controlling the manipulator to automatically change tools with respect to an operating head thereof.

Another object is to provide an automatic manipulator which is capable of multi-axis free travel on an operating surface and which is operable to perform a variety of different operations on or with respect to work.

Another object is to provide an automatic manipulator which may be remotely and automatically controlled to change tools and article handling devices on its operating head.

Another object is to provide an automatic manipulator for a variety of different tools which may automatically perform such functions as drilling, spray painting, riveting and welding work without human attendance.

Another object is to provide an automatic manipulator which is particularly applicable in flexible manufacturing systems and operations involving different machining operations by the manipulator.

Another object is to provide an automatically operable coupling means for coupling and uncoupling tools and handling devices with the operating head of an automatic manipulator whereby tool and handling fixture changing means may be automatically operated without human effort.

Another object is to provide coupling arrangement for automatic tools and manipulators for both mechanically operatively connecting motorized tools, such as drill quills and the like and electrically connecting same without the need for human attendance or effort.

Another object is to provide a free travelling automatic manipulator with stabilizing means which may be automatically employed to support the manipulator during its operations on work.

Another object is to provide an automatic manipulator which is operable to automatically apply fasteners, such as self drilling and tapping screws, rivets and other fasteners to work.

Another object is to provide an automatic manipulator which uses an expendable material such as coating material, cutting fluid, cooling fluid, welding material, fasteners or other material in its operation on work, wherein means are provided for replenishing such material from a supply thereof carried by the manipulator, and such replenishing is automatically effected.

With the above and such other objects in view as may hereinafter more fully appear, the invention consists of the novel constructions, combinations, arrangements of parts and control arrangements as will be more fully described and illustrated in the accompanying drawings, but it is to be understood that changes, variations and modifications may be resorted to which fall within the scope of the invention as claimed.

DESCRIPTION OF THE DRAWINGS

FIG. 1 is a side view of a monitor station with means for remotely controlling machinery, such as one or more automatic manipulators and/or computers associated with or supported by such machinery or manipulators.

FIG. 2 is a side view of a free travelling manipulator and a rack for a plurality of tools which the manipulator may change and operably retain.

FIG. 3 is a perspective view of the manipulator of FIG. 2.

FIG. 4 is a side view with parts broken away for clarity of part of the manipulator of FIG. 3.

FIG. 9 is a side view of an automatic manipulator having a tool holding and storage turret supported at the base of the manipulator.

FIG. 10A is a partial side view with parts broken away and removed for clarity of an operating head tool receptacle capable of removably receiving and operatively retaining tools thereon by means of a threaded coupling.

FIG. 10B is a partial side view with parts sectioned of a tool retainer such as employed on the manipulator of FIG. 9.

FIG. 11 is a side view of an alternative embodiment of an automatic manipulator surrounding and capable of moving along a guideway.

FIG. 12 is a side view of an automatic manipulator capable of multi-axis free travel on a surface and having a supply of fasteners, welding, coating or other material to be used or dispensed by the manipulator during its operation with means supported by the manipulator base for replenishing material from such supply and having two tool holding fixtures.

DESCRIPTION OF THE INVENTION

Figure 5:
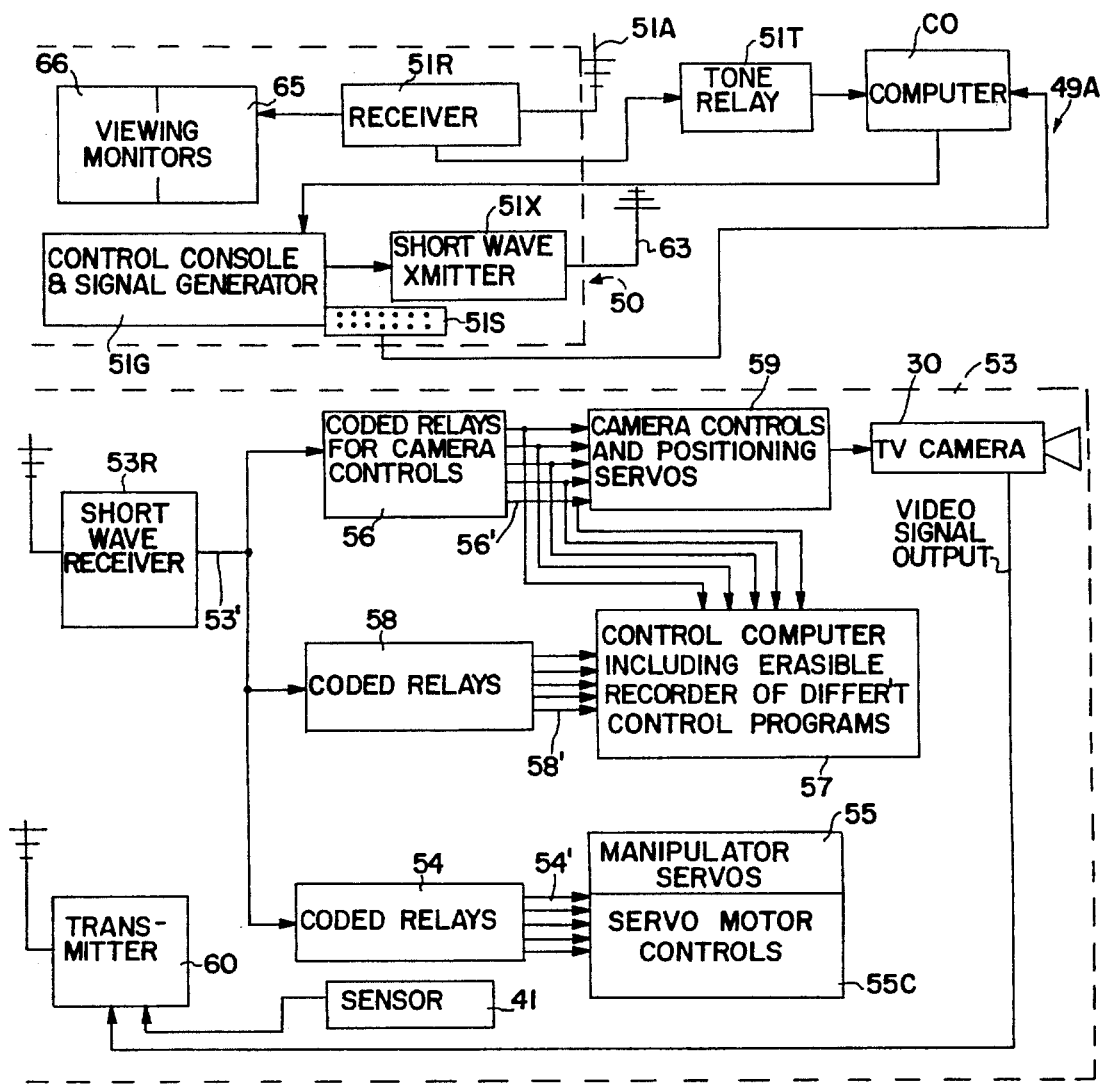
FIG. 5 is a schematic control diagram illustrating a system for both remotely and automatically controlling automatic manipulators of the types defining the instant invention.
Figure 7:
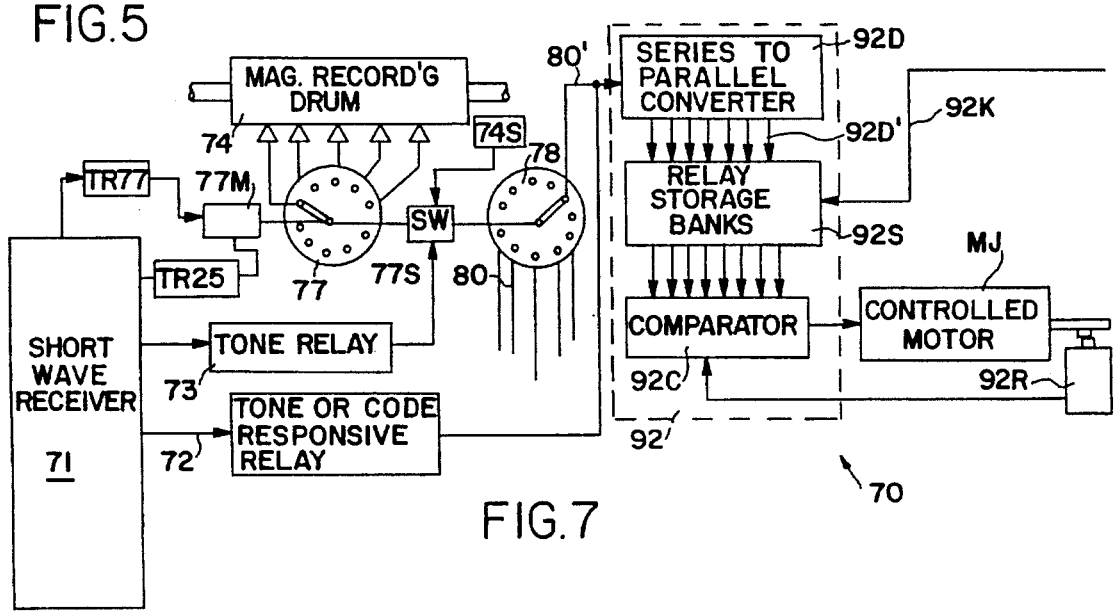
FIG. 7 is a schematic diagram showing additional details of a control system for automatically controlling machines such as the manipulators of the invention.
Figure 6:
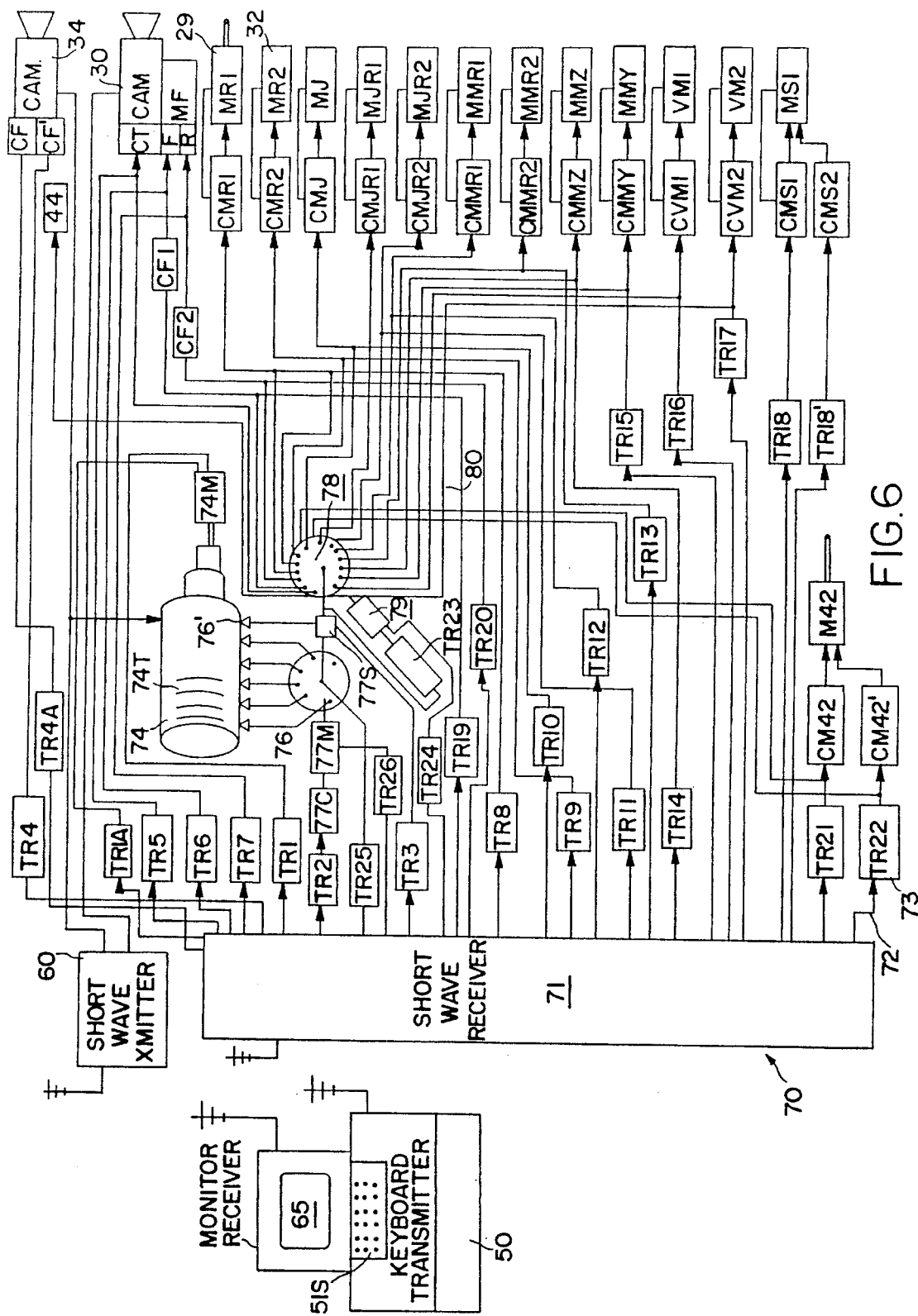
FIG. 6 is a control diagram which schematically illustrates further details of an automatic control system for the embodiments of the invention illustrated in the other drawings.

With respect to the control system employed herein, particularly illustrated in FIGS. 5 to 7, it is noted that block diagrams are provided in order to simplify the drawings, particularly to avoid providing redundant information when components and subsystems are known in the art. To further simplify the drawings, sources of electrical energy have been eliminated from the drawings and it is assumed that the correct power supplies are provided on the correct sides of all motors, solenoids, relays, amplifiers, transmitters, short wave receivers, television cameras and their controls and the other components and subsystems of the drawings and described in the specification hereafter.

The instant invention is primarily concerned with an automatic manipulator which may be used to perform a variety of functions which currently require human labor and to perform such functions efficiently and without hazards to human beings. Unlike conventional industrial manipulators which are automatically controlled by signals generated from memories or by limit switches, the control means for the manipulators of the instant invention include both an automatic controller such as a programmer or computer and a remote control system which is supervised and operated by one or more persons who may either view the manipulator directly or who employ television to view one or more areas which may include the environment adjacent the manipulator, a component of the manipulator or the entire manipulator in action and part of the environment adjacent thereto. A television camera mounted on the upper portion of the manipulator, may be fixedly or movably supported thereon and directed to scan the manipulator arm or fixture, the tool or handling device supported thereon and the environment adjacent the manipulator so that an operator who views a monitor screen remote from the manipulator may either completely direct its operations in handling work or performing operations thereon or may preposition the manipulator head prior to starting an automatic control cycle in which the manipulator performs one or more operations automatically thereafter. The automatic cycle may be complete in itself to effect completion of the operation or may terminate at a point where a variable movement or operator controlled or initiated operation is required where upon the operator may automatically or remotely control the manipulator by push button means which generate or select control signals which are transmitted to the manipulator.

The manipulator employed in the instant invention is a self-propelled, ground travelling unit having a single seizing head supported on an extendable arm which is part of a fixture which is power driven up and down a column supported by a carriage which is track or belt driven along the ground. The carriage also supports a short wave receiver for control signals generated at a remote monitor station, a transmitter for television signals and, in certain instances, feedback signals which are representative of the operation of one or more of the manipulator components or other sensors associated with the manipulator. The carriage also includes a power supply for operating the various motors and other devices mounted on the manipulator and a program controller or computer adapted to control the operation of the manipulator either in response to signals generated by sensors on the manipulator or signals generated remotely by a person monitoring the operation of the manipulator and/or the movement or work material adjacent thereto.

The manipulator carriage also supports a plurality of extendable fixtures or arms which are power operated to extend therefrom to support the manipulator and prevent it from tipping over when either handling heavy loads or when operating a tool disposed at the end of its arm wherein the tool in its operation on the work creates a force which may ordinarily tend to move or tilt the manipulator, if not tip it over. The extendable fixtures may fixedly retain the manipulator in place while it operates or performs part of an operation or may provide such support while the manipulator is moving along the ground. Extension and retraction of the fixtures relative to the manipulator or carriage may be both remotely controlled by an operator and automatically controlled by either the program control means or computer for controlling the operation of the manipulator or in response to signals generated by sensors which either sense movement or tipping of the manipulator during an operation or a drastic shift in the center of gravity of the manipulator due to a weight lifted or about to be lifted or the operation of a tool on work. In a particular mode of operation involving the use of such extendable fixtures or arms, command control signals may be generated by a computer which extends the supporting fixtures during a particular operation or part of a cycle in which the manipulator arm is extended while picking up a heavy weight or performing part of an operation on work, whereafter other signals are generated which retract the supporting fixtures off the ground to permit movement of the carriage or when the upsetting force is removed to permit further automatic operation of the manipulator.

In yet another form of the instant invention, a tool or head holding stand is provided which is accessible to the manipulator and which holds either or both tool heads and article seizing heads of different function, in predetermined locations thereon and automatic or remote control means are provided for enabling and effecting the change of one tool or head on the manipulator to another. Automatic tool or head release and locking means are provided to permit the automatic or remotely controlled operation of the manipulator in the act of replacing one head with another selected head in response to signals which are generated by the computer or by a person remotely monitoring the manipulator operation.

Further means are also provided wherein the television signals generated by the manipulator mounted television camera are automatically analyzed at the monitor station or by the computer at the manipulator and the results of such analysis are utilized to automatically control the manipulator or to select a particular control signal program to control the manipulator in its operation thereafter.

There is shown in FIGS. 1–4 components of an automatic article handling system which includes one or more article manipulators 10 located remote from a control monitor station 50 and operable in either of two modes of operation, one being an automatically controlled mode in which a computer generates signals for controlling the operation of the manipulator to perform functions relating to picking up, transporting, releasing or otherwise manipulating articles located within the realm of operation of the manipulator. The second function which may be performed in conjunction with or as a supplement to the automatic control function or as a separate operation when the automatic control function is either not functioning or is incapable of being performed under the direction of a computer, comprises remote control of the manipulator by manual means generating command control signals at the monitor station which are transmitted by short wave or other suitable means to the manipulator.

The manipulator 10 comprises a base or carriage 20 having an upstanding column or guideway 11 supported thereon and supporting a television camera 30 at the upper end thereof and a turret carriage 13 which may be driven up and down the column as well as being rotated with the column on base 20. The column 11 is a hollow, tubular housing having opposed slotted openings 11S and 11S' extending substantially the vertical length of the column. Located within column 11 is an endless drive belt 36 supported between an idler pulley 35 and a driven pulley 37 which either direction by belt or chain drive from a reversible gear motor 39 located at or beyond the bottom of the column. The belt or chain 36 is connected to a tubular housing 15 which extends through openings 11S and 11S' and is preferably slidably engaged in said openings as part of the assembly 12 which includes the turret 13. Thus as belt or chain 36 is driven by motor 39 in one direction, the turret assembly 12 will move either upwardly or downwardly on the column and, when the chain or belt 36 is driven in the opposite direction, the turret will move in its other direction. Thus, depending upon how motor 39 is controlled, the degree and direction of movement of the turret assembly may be varied and controlled in accordance with the control effected of motor 39.

Protruding outwardly from tubular housing 15 is a shaft 16 which is movable through said housing and is urged to project and retract an article seizing head 18 by means of a lineal motor 17 located at the rear end of housing 15. The output shaft 17S of motor 17 is connected to shaft 16 and is either driven outwardly from said motor by fluid pressure which is selectively applied thereto or other suitable power means.

The article seizing head 18 is composed of jaw members 26 and 27 comprising a jaw assembly 25 which includes a motor 28 or actuator which is operable to open and close the members 26 and 27 to seize and release articles in alignment therewith. Also mounted at the end of arm 16 or directly on the jaw assembly is a small television camera 34 which is located to scan directly above or alongside the jaw members for close-up viewing of the phenomenon directly in front of the jaw assembly 25.

The column 11 contains a large circular bevel gear 11G secured near the end thereof, the teeth of which gear are engaged by the teeth of a small bevel gear 19S connected to the output shaft of a reversible gear motor 19 which is supported below and to the side of the column 11 on the housing 20A of the carriage 20. Thus, the entire assembly including column 11 may be selectively rotated to position the jaw assembly 25 in alignment with most any object or article located adjacent the manipulator 10 by suitably controlling the operation of motors 19, 17 and 39.

The carriage 20 contains means for supporting two separate cleated belts or tracks 23A and 23B, each of which is separately power driven by a separate reversible gear motor, VM1, and VM2 [not shown] which are supported on the carriage frame 24 and which are selectively remotely controllable to drive their respective belts in either direction to position the manipulator 10 at various locations in its realm of operation. Thus, not only may the powered arrangement of FIG. 3 be utilized to drive the manipulator 10 back and forth when both motors VM1 and VM2 are simultaneously operating in the same direction, but it may also be utilized to turn the manipulator 10 when one motor drives its belt either without the operation of the other motor or by driving the other belt in the opposite direction, thus causing the manipulator carriage 20 to be driven in a circular path.

Suitable remotely controllable electrically braking or holding devices are preferably provided to retain each of the described movable components in position while one or more of the other components are operated. For example, a solenoid or motor 44 supported on turret 13 may have its output shaft projectible against column 11 such that when it is projected, it will hold the column in place against shifting either upwardly or downwardly during the operation of the manipulator head either in movement toward or away from the turret or in pivotal movement. The jaw assembly 25 is also pivotally mounted at the end of shaft 16 and is selectively pivoted to provide the jaws 26 and 27 in a plurality of attitudes, by selective operation of a motor or actuator 18A located at the end of shaft 16 on the seizing head. The small camera 34 is preferably located such that it will swing about the pivot of the jaw assembly 25 so that it will always have its scanning axis in the direction of the jaws.

The television camera 30 at the upper end of platform 11 is preferably pivotally supported on a bracket mount 31 located on a disk-shaped platform 29 which is rotatable about the vertical axis of column 11 at the end of said column. Gear teeth 29G formed in the periphery of the platform 29 are engaged by the teeth of a spur gear 28A supported by the shaft of a reversible gear motor 27A which is supported at the upper end of column 11 for rotating platform 29 and camera 30 supported thereabove. The camera 30 is pivoted about a vertical axis by means of a lineal actuator or gear motor 32 which is supported by platform 29 and has its shaft 32S pinned to a slotted opening in a bracket 33 secured to the rear of the camera housing. Thus, by predeterminately controlling reversible gear motors 27A and 32, the scanning axis of camera 30 may be varied to permit a person monitoring the space surrounding the manipulator to view different areas thereof from a remote location such as monitor station 50 of FIG. 1 as will be described.

Lineal actuators or fluid cylinders 42 and 43 located at the front and rear of carriage 20 are operable to project their shafts 42S and 43S and end plate fittings 42F and 43F against the ground when it is desired to stabilize and support the manipulator, for example, when it is in the act of handling a relatively heavy load or when it desired to maintain said manipulator in place during the handling operation. The operation of actuators 42 and 43 is also preferably remotely controllable in the manner hereafter described.

A housing 20H supported by the carriage 20 preferably contains a short wave receiver for command control signals which are generated remotely such as at the monitor station 50 as will be described and, in certain instances, a recorder for said signals, logical circuitry for decoding the signals or a mini-computer operable in response to signals received from the remote monitor station for sensing signals generated by sensors located on the manipulator such as the television camera 30 and 34 as well as other sensors of the work, to control the manipulating operation.

Antenna 45 is supported by the housing of the carriage 20 for receiving short wave signals from the monitor station and, in certain instances, for transmitting feedback signals from the sensors of the manipulator. Accordingly, there is also provided in housing 20H a radio transmitter which is coupled or connected to receive signals from the sensors of the manipulator and to transmit same by short wave to a remote location such as a receiver at the monitor station 50.

The monitor station 50 which is illustrated in part in FIG. 1 includes a control console 51 having a short wave receiver 64 including television receiving devices 65 and 66 which include respective viewing screens 65A and 66A for viewing the fields scanned respectively by television cameras 30 and 34 mounted on the manipulator.

Keyboard 51S contains a plurality of control switches which, when activated by the operator of the console, generate command control signals, as will be described hereafter, which are transmitted to the receiver of the manipulator 10 and which are operable to cause the manipulator 10 to execute various actions in the performance of its duties. Remote manual control of the manipulator 10 may be effected by continuously transmitting different tone signals, combinations of tone signals or repetitively transmitting digital signals in the form of codes which are operable to selectively control the various described motors for operating the different components and assemblies of the manipulator 10.

In FIG. 2, the manipulator 10 is shown having a sensing device 40 which includes a surface sensing transducer 41 located at the end thereof. The sensing device 40 may comprise, in its simplest form, an arm which protrudes laterally outwardly from the manipulator 10, preferably in one of the directions of travel and mounting a transducer such as limit switch, photoelectric cell and relay or other form of sensor which senses a surface immediately in alignment therewith or contacted thereby and generates a signal indicative of the sensing operation which signal may be utilized to either initiate the operation of an automatic controller such as a mini-computer located on the manipulator in housing 20A or may be transmitted to the monitor station 50 and employed to effect generation of a plurality of command control signals from the memory of a computer located thereat to cause the manipulator to execute a preprogrammed cycle of operation under the control of said signals when they are received by the manipulator receiver. Work load W is to be picked up by the manipulator either in a cycle which involves manual remote control or automatic control by means of a computer. In FIG. 2, a rack 47 holds different types of seizing heads, each of which is predeterminately located thereon and is removable therefrom as a replacement for the seizing head of the manipulator 10 after the manipulator has deposited its seizing head at a predetermined location on rack 47 and has moved the end of shaft 16 into alignment with a selected seizing head which may be automatically coupled thereto as will be described.

There is shown in FIG. 5 broad aspects of an automatic control system 49A for manipulator 10 illustrated in FIGS. 1–4. The monitor station 50 contains the described video receivers and monitors 65, 66 which may comprise conventional short wave television receivers for receiving video signals from television cameras 30 and 34 and displaying, respectively, the areas surrounding manipulator 10 and that immediately adjacent the seizing head 18 to an operator sitting at the control console 51G.

The signal generator portion of the control console 51G operates in response to manual closure of selected keys of keyboard 51S or signals generated by a computer CO which operates in response to the activation of selected keys of keyboard 51S and/or signals received by the short wave receiver 51R of monitor station 50.

A tone or coded relay 51T is connected to the antenna 51A of monitor station 50 and has its output connected to an input to computer CO for generating codes on said input in response to signals received as transmitted from manipulator 10 and generated thereat in response to one or more sensors mounted on the manipulator and operable to sense and discriminate articles or objects immediately adjacent thereto.

The control signal generator 51G of control console 51 generates code signals or tone signals in response to selected operation of keyboard 51S or signals generated on the output of computer CO, and is connected to a short wave transmitter 51X which transmits said signals as short wave signals from its antenna 63 to a short wave receiver 53R located at manipulator 10.

The control system 53 at the manipulator includes a plurality of control modules 54, 56 and 58, each of which has its input connected to the output 53' of short wave receiver 53R. Module 54 comprises a plurality of coded or tone responsive relays connected in parallel to the input from short wave receiver 53R. Each of the relays has an output illustrated as one of the multiple outputs 54' of the coded relay bank 54 and extending to a respective one of the controls 55C for the servos or motor 55 described which operate the various components and assemblies of the manipulator.

A bank of coded relays 56 is provided having respective outputs 56', each of which extends to a respective control for positioning and adjusting the television camera 30 in response to specific code or tone signals received by short wave receiver 53R from the monitor station 50. The camera controls 59 may thus be selectively operated either in response to signals generated by the operator selectively operating keyboard 51S or signals generated by the computer CO.

These controls, as will be described hereafter, include controls for controlling pivotal movement of the camera 30 about a vertical and/or horizontal axis to permit it to scan different areas surrounding the manipulator. Further controls [not shown in FIG. 5] may also be employed and remotely controlled by respective of the coded relays 56 to control camera focus, lens opening, and other variables. Similarly, camera 34 which is mounted on or adjacent the manipulator seizing head 18, may also be remotely controlled to vary the scanning axis and focus thereof.

A bank of coded relays 58 is also connected to the output 53' to receive the tone or code signals generated thereon.

The outputs 58' of the relays 58 are connected to respective inputs of a control computer or programmer 57 to activate various controls thereof and effect the reproduction of different arrays of control signals generated as respective signal programs, each of which is operable to control the various motors or servos of the manipulator in such a manner as to cause the manipulator to execute respective movements to pick up, move a unit of work along a predetermined path and deposit said work unit at a selected location.

Computer 57 may also contain logic circuitry for performing various logical functions associated with the manipulator's operation under certain conditions to be described. Inputs 58' to computer 57 may be activated upon receipt of suitable signals from the monitor station signal generator 51 to perform such functions as [a] operating switches in the computer for selectively reproducing signals which are operating to control the manipulator to move its seizing head 18 ill a particular path with respect to the manipulator to seize, transfer and release an article between two points in space which are predeterminately located with respect to each other; [b] operate control switches to effect repeat cycle operation of the same manipulation function a predetermined number of times; [c] operate control and logical switches to permit different cycle commands to be reproduced in any sequence; [d] condition the recording means of the computer to record new commands as received from the control console; [e] condition the recording means of the computer 57 to record command signals as received from signal generating means such as analog to digital converters and/or generators associated with the operation of the manipulator arm, turret, jaw and column operation as well as the operation of the carriage supporting and driving manipulator 10.

Also shown in FIG. 5 is a short wave transmitter 60 mounted on manipulator 10, as described, for transmitting both the video signal outputs of cameras 30 and 34 and, when applicable, the outputs of one or more sensors such as sensor 41 projecting from the manipulator jaws, arm, column, or carriage described and operable to sense a surface such as that of an object or workpiece immediately adjacent manipulator 10 to be handled thereby.

FIG. 6 shows further details of the automatic control system illustrated in FIG. 5. The system permits manipulator 10 to operate in an automatic mode under the control of its own program controller or computer, or in response to signals generated from a remotely located computer which is disposed at or near the monitor station or is in communication therewith. The system of FIG. 6 also provides for the remote automatic control of the manipulator in response to signals generated by manually closing switches at the monitor station to generate selected tone or code signals which are transmitted by short wave to the manipulator's short wave receiver which signals may be utilized to effect control of either the entire operation of the manipulator or a portion of its operation in performing a particular handling function such as its movement to align its seizing head or arm assembly with an object to be manipulated thereby or otherwise performed on.

In FIG. 6 a short wave receiver 71, equivalent in function to the receiver 53R of FIG. 5, operates to receive command control signals in the form of chains of codes or tones generated by the selected operation of keyboard switches 51S of the control console of the monitor station. Receiver 53R is also adapted to receive and pass command control signals generated by computer CO of FIG. 5, together with any keyboard switch generated signals, on a common output (not shown) which is connected to a plurality of outputs 72 which extend to respective tone or code responsive relays 73 which are further denoted by letter notations TR followed by respective numerical notations, each of which relays is connected to control the operation of a motor, motor control or other device associated with manipulator 10 when it receives a specific tone or code signal to which it is responsive to the exclusion of the other relays.

Thus, while all of the remotely generated control signals received by receiver 71 are passed on a common output of receiver 71 to all of the tone responsive relays TR, each of the relays responds only to a particular tone or code signal which causes it to generate a control pulse or a signal during the time the relay is energized. A first relay TR1 has its output connected to a control input for a constant speed motor 74M operable by a signal from coded relay TR1 to drive a magnetic recording drum 74 at a constant speed. Drum 74 continues to be driven by motor 74M until a second signal is received by short wave from receiver 71 or is reproduced by a head 76' scanning a separate record track which signal is passed to a flip-flop switch forming part of the control for motor 74M, thereby deactivating the motor.

The recording drum 74 of the manipulator control system 70 contains a plurality of separate record tracks 74T, each of which contains a series of command control recordings interposed between gating signals which are operable to gate respective portions of the command control recordings to different controls for the different motors or servos controlling the operation of manipulator 10 to cause it to execute a particular operation involving the movement of the seizing head thereof to a particular location in its path of travel with respect to the support or carriage of the manipulator, seize or otherwise operate on a workpiece located in alignment therewith, transport the workpiece along a predetermined path to a second location by the controlled movement of the servo or motors of manipulator 10 which may or may not include the motors driving the carriage thereof and release the workpiece held thereby or otherwise preposition or perform predetermined operations with respect to the workpiece.

A second tone or coded relay TR2 is activated by signals generated on an input thereto which may originate at the monitor station 50 or may be otherwise generated as will be described, and is connected through an input 77C to pulse a stepping motor 77M which predeterminately operates a first stepping switch 77 having input thereto from one of the magnetic pick-up heads 76' which are transducers operable to reproduce from respective of the record tracks 74T of the magnetic drum 74.

Depending on the number of times the stepping motor 77M is pulsed by signals applied to the input of relay TR2, a selected one of the heads 76 reproducing from a selected record track 74T, will be connected to the output of switch 77 through a bi-stable switch 77S to the input of a second rotary stepping switch 78 which is operated by a stepping motor or solenoid 79 when pulsed to selectively connect the input to one of a plurality of outputs 80 thereof which extend directly to the controls for the various motors, servos and solenoids operating the manipulator 10. The stepping motor 79 is controlled in its operation to gate selected portions of the command control recordings reproduced from the selected record track 74T to the controls for the various devices to be controlled by said recordings by a tone relay TR23 which is connected directly to the output of rotary stepping switch 77. Accordingly, signals are recorded on each of the record tracks 74T between the command control recordings which are operable to activate relay TR23 and step switch 78 to its next position prior to the reproduction of the next group of command control recordings from the track of drum 74 which is being transduced. The drum 74 is preferably driven at a slow enough rotational speed by motor 74M to permit each motor or servo driving a component or assembly of the manipulator to perform its function before the next group of command control recordings from the drum is reproduced.

Each of the outputs 80 of stepping switch 78 is connected to a respective motor control or control subsystem denoted by the general notation CM for the various motors or servos associated with manipulator 10. Control CMR1, for example, controls a first motor MR1 and may be utilized to rotate one of the scanning television cameras such as camera 30 in the direction defined by the particular command control signals received thereby after being reproduced from a portion of a selected track of drum 74. A second control CMR2 receives its signals from a particular output of stepping switch 78 and controls the operation of a second motor MR2 in the manner described hereafter.

Motor control CMJ is for motor M3 which may be equivalent to motor 19 of FIG. 3 operable to predeterminately pivot seizing head 18 of manipulator 10. Controls CMJR1 and CMJR2 respectively control motors or solenoids MJR1 and MJR2 which operate each of the jaws or clamps forming part of seizing head 18. Controls CMMR1 and CMMR2 which are also connected to respective outputs of stepping switch 78 respectively control motors MMR1 and MMR2 which may comprise motors respectively operable to rotate arm 16 on the support therefor to vary the attitude of seizing head 18 and to rotate column 11 on the carriage supporting same, such as motor 19 of FIG, 3.

Controls CMMY and CMMZ respectively control motors MMY and MMZ which may respectively cause the up and down movement of the turret assembly 12 on column 11 and the projection and retraction of arm 16 and manipulator head 18 held thereby with respect to the turret. Each of the described controls denoted CM is not only operably connected to a respective output of stepping switch 78 so that it may receive its particular component or group of signals reproduced from the selected track of drum 74 but is also connected to a respective tone or code operated relay denoted TR8 to TR17 which relays receive their inputs from short wave receiver 71 and are each energized by a particular tone or code signal generated at the monitor station when the operator selectively activates switches of the switch keyboard 51S in effecting a manual mode of remote control of the manipulator.

Prior to effecting such manual control, the operator at the monitor station may generate a particular tone or code which he transmits to activate relay TR1 which terminates the operation of motor 74M stopping rotation of drum 74. An auxiliary relay TR1A may also be activated by a particular signal generated by selective operation of a switch of keyboard 51S for controlling motor 74M to fast-rotate drum 74 to a start location which start location is determined by a pulse signal recorded on one track of the drum and reproduced by pick-up 76'. The signals reproduced therefrom will be those initiating a cycle of control.

The operator at the monitor station also generates a signal by selectively operating a switch of keyboard 51S which energizes a tone or code responsive relay TR3 which is operable to open switch 77S and retain same open until closed after the manual remote control function is terminated so that any signals which may be reproduced from a track of drum 74 during further movement of the drum such as to a home location, will not be passed through rotary switch 78 to any of the motor controls for the manipulator.

Forward and reverse drive controls CMS1 and CMS2 are for a motor MS1 which drives the mount for sensors 41 of FIG. 2 outwardly from manipulator 10 into sensing relationship with a surface in alignment therewith. Motor MS1 is operated by code signals generated by the operator at the monitor station and transmitted to the inputs of tone responsive relays TR18 and TR18' which are connected to controls CMS1 and CMS2.

Controls CF1 and CF2 respectively control the forward and reverse drive of a motor MF for varying the focus of television camera 30 in accordance with signals received by tone or code responsive relays TR19 and TR20 which are connected to the short wave receiver 71. Camera focus may also be controlled by signals reproduced from the drum 74. Control CT is for power energizing video camera 30.

Motors MR1 and MR2 respectively control the rotation of camera 30 about vertical and horizontal axes, as provided in FIG. 3, and are respectively controlled by signals energizing tone or code relays TR8 and TR9. The close-up television camera 34 may also be remotely or automatically controlled in a like manner. Tone relays TR4 and TR4' are energized by received tones or codes generated by actuating respective keys of keyboard 51S to operate the zoom lens of focus controls CF and CF' to operate a motor for varying the focus of the camera 34 in one direction.

Also shown in FIG. 6 are controls denoted CM42 and CM42' which are operable, when activated by either respective signals generated by operation of suitable keys of keyboard 51S at the monitor station and received by the short wave receiver 71, to cause the lineal actuator 42 shown in FIG. 2 to project its shaft 42S to bring the end plate fitting 42F against the surface of the ground to the rear of the carriage 20 of the manipulator 10 for stabilizing and preventing the carriage from tipping over or moving as a result of a reaction force applied to the upper structure of manipulator 10 when the article seizing head or tool 18 is operatively engaging or acting on a unit of work.

While only one actuator 42 is shown in FIG. 6 as controlled by signals generated remotely by an operator at the monitor station or generated as reproduced from the memory drum 74, a number of similar actuators, such as actuator 43 of FIG. 2, which are projectable downwardly from the carriage of the manipulator, may also be provided and similarly controlled to provide extensible stabilizing devices at a number of locations around and outwardly from the manipulator carriage, depending upon the type of operation or weight being lifted by manipulator 10.

Respective tone or code responsive relays TR21 and TR22 each have their inputs connected to the output of the short wave receiver 71 and are each adapted to respectively energize the controls CM42 and CM42', which when so energized respectively control arm 42S of actuator 42 to project the stabilizing fitting 42F against the ground and retract it therefrom. As indicated above, actuator 43 may be similarly controlled to project its arm 43S and fitting 43F against the ground in front of manipulator carriage 20 simultaneously as actuator 42 is operated to stabilize manipulator 10 both in the front and rear thereof as may two or more additional actuators project their stabilizing plates adjacent both sides of the carriage during a particular operation of manipulator 10 or a series of operations wherein it is not necessary to drive manipulator carriage 20 to effect each operation.

Also shown in FIG. 6 are means for remotely causing the rotary stepping switches 77 and 78 to attain respective home or zero positions permitting the operator at the remote location to more rapidly and easily control each to respectively effect the reproduction of communication signals from a selected track of the record drum 74 for automatically controlling the performance of a particular manipulation operation and conditioning switch 78 so that it may operate thereafter to permit the performance of the selected operation. The necessity of causing switch 78 to have its rotary arm home to a zero location by the remote control thereof may be eliminated if each command control message recorded on the drum 74 contains a signal or signals at the end thereof which, when reproduced at the end of a cycle, properly control the stepping motor 79 to step the switch rotary arm to its home location.

Accordingly, servo devices 77M and 79 may each comprise a stepping motor with an input from its respective tone responsive relay for stepping the switch arm thereof in one direction and a reverse drive motor connected to drive the switch arm in the reverse direction until the home location has been attained thereby. A tone or code responsive relay TR25 is responsive to a signal generated by depressing a selected switch of the keyboard 51S for generating a selected tone or code. Energization of relay TR25 generates a signal which is passed to an input through the rotary switch drive unit 77M for causing the motor thereof to drive the shaft driving the arm of switch 77 to its home location whereupon a shaft cam or pin closes a limit switch causing the motor to stop.

Tone responsive relay TR24 similarly causes rotary switch drive unit 79 to operate and drive the arm of switch 78 to home at which a limit switch is actuated by a cam or pin on a shaft thereof and stops the arm of switch 78. Other means such as electrical counters and code matching means may be provided to control switches 77 and 78 or the non-rotating electronic equivalence thereof to properly function and gate selected command messages to relay storage for controlling manipulator 10 as described.

A typical control circuit for one of the manipulator servos or motors MJ is shown in FIG. 7 and similar circuits may be applied to controlling any of the described manipulator motors or servos. Selected of the command control signals reproduced from a selected track of magnetic drum 74 are gated to the input of an automatic control subsystem 92 and are temporarily stored therein such as in relay storage or an integrated circuit storage network, reference being made to U.S. Pat. No. 3,412,439 for further details of such storage and control arrangement.

After being so stored, the signals representative of the particular command control function are read out from storage, upon command, and are applied to automatically control the servo or motor associated therewith to drive one manipulator component or assembly along a particular path and for a predetermined distance.

In FIG. 7, a particular group of command control signals is reproduced from the selected track of drum 74 when rotary stepping switch 77 is automatically remotely controlled either when the operator at the monitor station generates a selection signal or a computer located either remotely or on the manipulator senses and identifies the work piece aligned with the manipulator and generates a signal representative of the work piece which signal is applied to logical circuitry (not shown) and is utilized to operate the switch 77 to connect a transducer reproducing from a selected track of the drum with the distribution rotary switch 78.

Since the signals reproduced from each track are recorded in series, they are converted to parallel code either immediately after they are passed through rotary switch 78 or in each of the control subsystems 92 by means of a series-to-parallel converter 92D, the outputs 92D' of which are connected to the relay or core storage banks 92S which hold the command control information in storage until a feedback read-out signal is generated on an input 92K thereto after which the signals are passed to a comparator 92C which receives feedback signals generated as the controlled motor MJ operates and which comparator generates a difference or control signal on its output for controlling the controlled motor in accordance with the difference between the feedback signal and the signals passed thereto from the storage means 92S.

Such a feedback, closed-loop control system is shown in greater detail in U.S. Pat. No. 3,412,431 wherein a variable potentiometer 92R is coupled to sense the rotation of the controlled motor and generates feedback signals representative of said rotation to the comparator and wherein the comparator generates difference signals which are applied to the input of the controlled motor to assure that it is controlled in accordance with the information defined by the command control signals reproduced from the selected track of magnetic drum 74.

The closed-loop control system illustrated in FIG. 7 may be applied to any or all of the motors for controlling the operation of manipulator 10 and the one or more television cameras 30 and 34 supported thereby, shown in FIG. 6. If the respective portions of the command control recording reproduced from the selected track of drum 74 are each gated to respective control subsystems of the type shown in FIG. 7, the drum may be rotated to complete a revolution and stopped prior to the completion of the particular predetermined cycle of operation of the manipulator and the cycle may be repeated either automatically or in response to a signal generated at the monitor station or by the sensor of the manipulator which is applied to a control such as that applied to rotate drum 74 for one revolution and terminate the operation of the drum motor when the single revolution of the drum is completed.

The manipulator illustrated in FIGS. 2–4 may also be operated in an automatic or remote controlled mode to change its own seizing head 18 in accordance with the type of article or object to be seized and transported or worked on thereby. Accordingly, a rack 47 is provided within the realm of operation of the manipulator which rack contains a plurality of tools and seizing heads 49 disposed at different locations thereon. A motorized tool 48 is also located at the top of rack 47 which tool 48 may be remotely controlled after manipulator 10 is predeterminately positioned relative thereto and which may operate to loosen and/or tighten one or more fasteners associated with the manipulator such as fasteners for securing and releasing seizing head assembly 18 at the end of arm 16.

In other words, by properly automatically or remotely controlling the movement of manipulator 10 and its components, seizing head assembly 18 or other portions of manipulator 10 may be predeterminately aligned with the motorized tool 48 which may be operated thereafter, either in an automatic mode controlled by command control recordings or a computer, or in a mode which is controlled by signals generated by manually operating switches at the control console, to tighten, loosen or release fasteners associated with manipulator 10 permitting seizing head 18 to be released therefrom when it is thereafter engaged by a particular portion of rack 47 such that a new seizing head or tool may replace same at the end of arm 16 by proper movement of manipulator 10 to engage the end of art 16 therewith.

The replacement may be effected by an automatic locking device located at the end of arm 16 or by further manipulating the arm to align it with the end of tool 48 which may thereafter be automatically or remotely controlled to lock or fasten the new manipulator head in place. Tool 48 or variations thereof may be operated to perform maintenance functions on manipulator 10 in accordance with signals generated either by the operator at the monitor station or a computer. One or more motor operated devices located on manipulator 10 itself may be remotely or automatically controlled to effect the securing and releasing of one or more components from manipulator 10 such as an article seizing head 18 or heads located at the end of arm 16.

Figure 8:
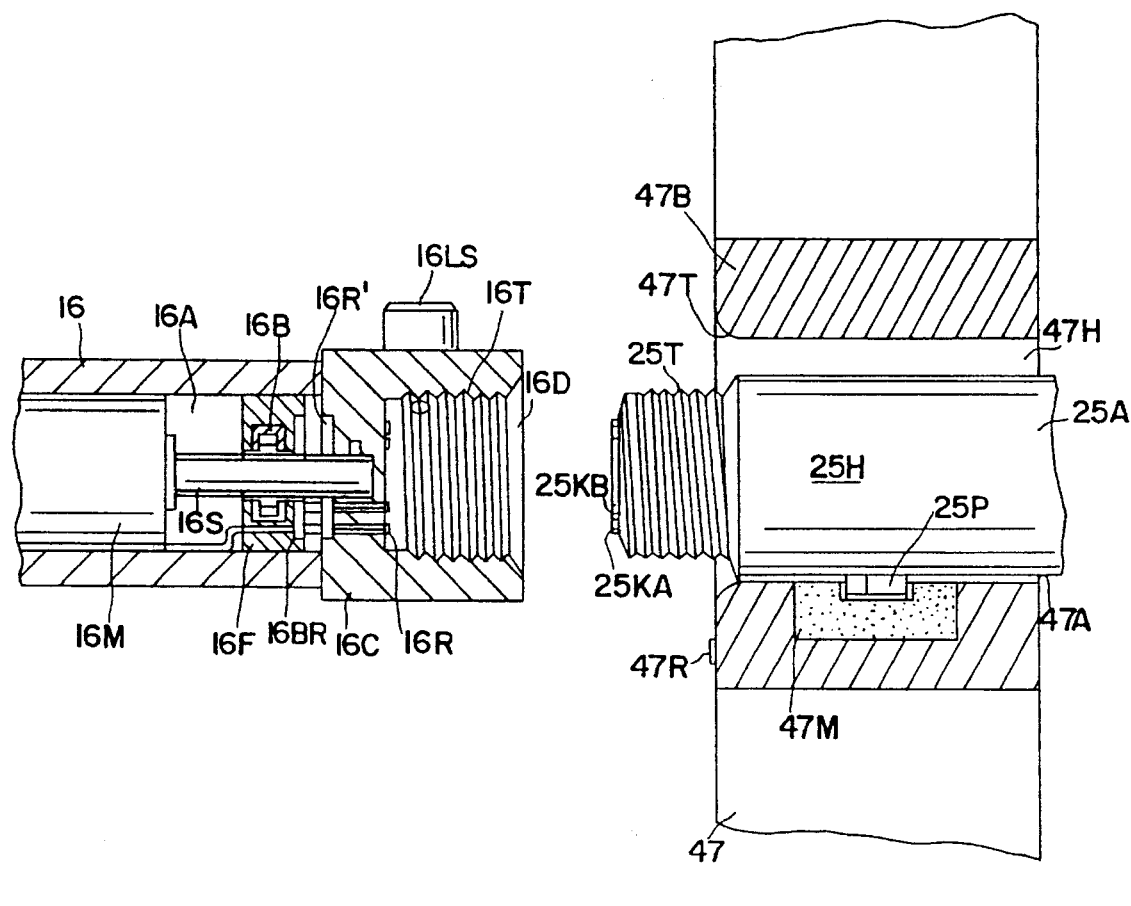
FIG. 8 is a side view with parts broken away for clarity of an automatic coupling arrangement for tools and handling devices to be attached to tool heads such as the manipulator heads of the manipulators of the instant invention.

In FIG. 8 is shown further details of the coupling apparatus associated with the manipulator head for permitting the manipulator to be remotely or automatically, controlled to change or replace the tool or seizing device with a new tool or seizing device. The laterally extending arm 16 of the manipulator of FIGS. 2–4 is modified in FIG. 8 and has a passageway 16A therethrough in which passageway is supported a reversible gear-motor 16M having an output shaft 16S which rotates in a tapered roller bearing 16B secured to a fitting 16F at the end of arm 16.

The shaft 16S is secured to one end of a coupling member 16C which is a cup-shaped retainer open at its outer end having the walls of the bore 16D thereof provided with threads 16T. Coupling member 16C is power rotated on shaft 16S either clockwise or counterclockwise depending on the direction in which gear-motor 16M is controlled to operate. The coupling member 16C is shown axially aligned with the exteriorly threaded end 25T of a device 25A which may comprise either a power operated tool such as a drill quill, rivet gun, spray gun, powered hammer or other tool or an article handling device such as a head mounting power operated jaws, suction cup seizing means, etc., connected to the other end of housing 25H for device 25A.

Housing 25H contains, in addition to means for holding the tool or jaws of device 25A, one or more motors or solenoids for operating said device as well as the necessary wires and controls for said motors. Housing 25H also contains two or more circular contact elements 25KA and 25KB supported by the end wall of the threaded end thereof. The contacts are each connected by wires to terminals of the motors supported in housing 25H for conducting electrical energy to the one or more motors located within housing 25H such as the motor or motors associated with opening and closing jaws supported on the housing, operating a solenoid which is operable to drive jaws, open or close a valve, etc., associated with the tool or handling device located within housing 25H.

The power operated tool or powered article seizing head 25A is shown supported in a selected storage location or bay 47A of the rack 47, which storage location may be one of a number of such locations extending vertically and/or horizontally on the rack with each location adapted to temporarily retain a different tool or seizing head for the manipulator in such a manner that the head or tool is fixed in location with respect to the rack and is retained thereon to permit its threaded end to be threadably connected to the coupling member 16C of the manipulator or removed therefrom.

The coupling means provided in FIG. 8, which may be varied somewhat in its construction and operation, is also operable to permit a tool or seizing head secured to the manipulator to be disposed in a selected storage bay and uncoupled from the manipulator to align the coupling member 16C with the selected storage location whereafter motor 16M is remotely or automatically controlled as described to permit the desired coupling or uncoupling operations.

In other words, when it is desired to provide a seizing head or tool at the end of the manipulator arm which may be utilized to perform a particular function which may not be performed by that tool or head which is already secured to the end of the arm, suitable operation of the manipulator may be effected to dispose the tool or head secured thereto, in a selected bay or storage location of the rack, then properly operate the manipulator and coupling means to effect uncoupling of the tool or head so disposed, then properly operate the manipulator to align the coupling means with a new selected tool or head, then properly operate the manipulator and coupling means to effect both mechanical and electrical coupling to the threaded end of the selected tool and finally, when such new coupling is effected, remotely or automatically operate the manipulator to remove its arm from the vicinity of the rack and to cause the tool head secured thereto to perform one or more programmed or remote controlled functions relative to work disposed in the realm of operation of the manipulator.

The storage bay 47A comprises a recess or horizontal opening 47H provided through a structural member or beam 47B which may be the sole vertical beam defining the rack 47 or may be one of a plurality of vertical and/or horizontal beams joined together and each containing a plurality of storage locations such as openings therethrough, each of which is adapted to receive and temporarily store a respective tool or seizing head in an attitude such as that illustrated in FIGS. 1 and 8 whereby the tool or head may be coupled to the manipulator and removed from the rack.

The opening 47H in the rack member 47B is greater in cross-sectional area than the greatest lateral cross-section of the tool 25A permitting said tool to be inserted therein and removed therefrom by the control movement of the manipulator and arm 16 thereof. Retention of housing 25H within the opening of the storage bay is effected in such a manner that it will not rotate when the coupling member 16C is power rotated against the threaded end 25T of the housing in either screw assembly or disassembly therewith. Various means may be provided for preventing the device 25A from rotating including shaping at least a portion of housing 25H to conform to a mating portion of the wall of the opening 47H.

In FIG. 8, a magnet 47M is secured within a recess in the bottom portion of the wall surrounding the opening 47H. If housing 25H is made of a suitable paramagnetic material, such as tool steel, it will be attracted to magnet 47M which will hold the housing in place sufficiently to prevent its rotation during the rotation of coupling member 16C against the threaded end 25T of the housing. A protrusion or key 47P is connected to the wall surrounding opening 47H, preferably beneath housing 25H and is adapted to be inserted into a recess 25R in said housing to provide further support for the housing and prevent it rotation with the opening 47H during the coupling or uncoupling operations.

Once the manipulator 10 has been remotely or automatically controlled to axially align arm 16 with a particular tool located in a selected storage bay of the rack 47, the manipulator may be manually remotely operated, as described, or operated under computer or program control by selective reproduction of command control signals from the memory drum or tape described, to advance the coupling member 16C against the threaded end 25T of the tool and, as it further advances thereagainst, the motor 16M is properly operated to rotate the coupling member 16C in a direction to effect movement of the coupling member along the threaded end of the tool a sufficient degree to completely cause said threaded end to be completely advanced into the coupling member so that the contacts 25KA, 25KB, etc., at the end of the tool make electrical contact with respective electrical conductive rings 16R, which are insulatedly mounted against the end face of the bore 16D in the coupling member.

A locking device such as a small bi-stable solenoid 16LS may be secured to the outer wall of coupling member 16C and remotely or automatically operated by means of an electrical signal transmitted thereto after coupling is effected, by one of the means described, to project its actuator into a recess or hole provided in the threaded end of the tool 25A to prevent rotation thereof during the operation of the tool and to lock the tool in place. Prior to effecting an uncoupling of the tool, the retract-input circuit to the bi-stable solenoid 16S is pulsed either by a signal which is generated by a remote operator or by a signal generated by the described computer, to permit the tool to be uncoupled from the end of the manipulator arm so that it may be replaced with a new tool.

Electrical coupling means has been provided in FIG. 8 for coupling electrical energy and control circuits located in the tool or manipulator head with controls located on manipulator 10. Fluidic coupling means may also be provided between the coupling member 16C, the arm 16 and the tool 25 when the tool and coupling member are connected together.

Various other forms of coupling devices may be employed to connect or disconnect different tools or article seizing heads to the end of the manipulator arm 16 and they may include air operated actuators, electromagnetic coupling means, spring operated mechanisms which are bi-stable or monostable in their operation and which effect mechanical coupling when the tool and coupling device at the end of arm 16 are pushed together and disconnection when the two are properly pulled or otherwise forced apart.

The described automatically operated tool 48 may comprise in its simplest form an electric motor, connected to a source of electrical energy through a normally open switch which is closed temporarily by signals transmitted thereto either from the described program controller or computer mounted on the manipulator or from a tone responsive relay of the type described which responds to signals of a particular tone received by the short wave receiver of the manipulator and generated either by a remote computer or closure of a switch on the control console keyboard 51S. The output shaft of the motor driving tool 48 may comprise a screw driver or other form of coupling device which, in its simplest form may merely rotate at constant speed.

In a more complex form, the output shaft of tool 48 may be power driven by one or more control motors to vary its attitude and it may also include a manipulator, having features of the manipulator 10 or a conventional multi-axis manipulator which may position its tool in a plurality of attitudes, as well as drive the tool outwardly therefrom in a selected direction to couple to a plurality of devices associated with the manipulator 10 for tightening or loosening same to tighten, adjust or change components of the manipulator.

A number of variations may be provided in the means for effecting remote control of the described self-propelled manipulator from the monitor station 50. These techniques include the following which may be used per se or as auxiliary to the means hereinbefore described:

A. One or more pivotally operated control sticks may be provided on or adjacent to the control console 51 for remotely controlling movement of the carriage 20 along the ground and the operation of the various motors or servos associated with the article manipulation apparatus described which projects upwardly from said carriage. A single "joy" stick may be gimbal mounted on the carriage and operable to activate or close different switches depending on the direction in which the stick is manipulated by hand wherein each switch connects a different tone or control signal generator with a power supply and a short wave transmitter of the type described to generate and transmit corresponding tone or code signals to the receiver of the manipulator which signals are thereafter employed, as described, to automatically control the operation of the motors driving the carriage to controllably maneuver said carriage into position with respect to work to be handled by the manipulator and/or the article handling manipulation apparatus supported by said carriage. One or more additional control sticks may be similarly utilized to remotely control the operation of the article manipulating elements of the manipulator to position the article seizing head or jaws in alignment with a selected material or article to be handled thereafter either in response to further signals generated from the monitor station, command control signals generated by a memory or computer at the remote station or generated from a memory or computer mounted on the manipulator such as in housing 20H.

B. A pivotally operated control stick of the type described may be utilized to generate different control signals for controlling the operation of the scanners or television cameras 30 and 34 as well as motors operating focus lens control for said cameras to permit the operator to scan the area around the manipulator and the area immediately in front of the seizing head of the manipulator.

C. If a digital computer is utilized to effect either or both automatic local and remote control of the manipulator, it may receive input or feedback signals both from a device such as switches, a control stick or sticks of the type described or a light pen which is hand manipulated and made by the operator to scan or contact that area of the field scanned and displayed on the monitor screen of the monitor stations to effect automatic remote control of the manipulator. Light pen signal generating means of the type provided in U.S. Pat. No. 3,346,853 may be provided to permit the operator to automatically control the manipulator by generating different signals as a result of predeterminately locating the light pen on the display screen displaying the area in front of or predeterminately disposed adjacent the manipulator and providing such signals either as code signals which are transmitted direct to the manipulator's receiver and used for controlling same or are transmitted to a computer which analyzes same and then generates control signals which are transmitted to the manipulator's receiver which utilizes same to effect automatic control of the manipulator.

A digital computer located on the manipulator as described may also receive and analyze signals generated at the monitor station as described above before generating signals for controlling the movement and operation of the manipulator.

D. The computer at the monitor station or a computer supported by the described manipulator may also receive signals generated when one or more of the described scanners scans the area adjacent the manipulator and may analyze such signals in such a manner as to provide information for properly controlling operation of the manipulator by generating suitable further control signals which are applied to control the various manipulator servo or motors. For example, video signal analyzing means of the type provided in my copending patent application Ser. No. 254,710, now U.S. Pat. No. 4,118,730, may be utilized to scan one or more of the video signals generated by either or both the television cameras 30 and 34 and generate useful information for the computer by digitizing said signals and performing computational operations on the digital signals so generated.

The results of such computing operations may be used directly or indirectly to (a) control the manipulator elements and carriage to move towards an identified object to position the seizing head of the manipulator for picking up or otherwise operating on the object, (b) query the memory of the computer and derive therefrom a particular group of signals representative of selected stored information and capable of automatically controlling operation of the manipulator to perform a particular operation on the work or to transfer same to a selected location, (c) automatically move the manipulator into operative relationship with the object scanned where remote or further automatic control may be effected, as described, to cause the manipulator to perform a predetermined operation on the object or to predeterminately transfer same or from which position further scanning and control operations may be performed.

The automatic article manipulation apparatus hereinbefore described is subject to a number of variations with respect to its construction and the mode of controlling same. For example, while the apparatus has been illustrated as being self-propelled on a tractor-like carriage wherein control of respective cleated tractor belts in their operation is utilized to control the direction of movement of the manipulator, a variety of modifications in the construction of the self-propelled carriage which supports the manipulator and the manner in which it is controlled in back and forth movement and in steering are possible. Furthermore, it is noted that the single-column structure which is provided for supporting the manipulator seizing head and arm assembly, may be replaced by a variety of different fixtures and structures which may contain either one or a plurality of seizing head assemblies which may be separately controllable to simultaneously operate on the same or different articles to be held or operated on by tools supported thereby.

Accordingly, the following variations in the design of the manipulator and its control systems are presented as a number of the possible alternatives coming within the purview of this invention.

I. The carriage which supports the program and remote controlled manipulator or tool head assembly may be movable along a track which is fixed with respect to articles to be operated on or be manipulated thereby, such as a ground or vehicle-mounted track. Conversely, the track itself may be movable on a support either in a direction normal thereto or may be pivotally rotated by a programmed or remote control means of the type described, on a further support which is secured to the surface of the ground or comprises a movable vehicle which may also be controlled.

II. Instead of being supported by a carriage at the bottom of the tool carrying fixture or manipulator, the carriage may also be supported from overhead and may be operable to travel an overhead track such as a monorail or a birail track which is either fixed above the ground or is fixed on a vehicle or structure which is movable along the ground to permit the described manipulator or a modification thereof, to be transported to a particular site or location where the manipulator or automatic tool is to be operated.

III. The fixture which extends upwardly from or subtends downwardly of the carriage may comprise a plurality of vertically extending columns of the type described and illustrated in the drawings, each of which supports a separate article manipulator or tool head assembly which may also be of the type described or a modification thereof, for permitting the manipulator to perform a plurality of manipulating and/or assembly, inspection or machining functions relative to a plurality of articles or units of work within the realm of operation thereof. Such plural columns may be fixed with respect to the carriage or may be separately motor drivable thereon and operated either in coordination with each other or separately under remote or program control or in accordance with the teachings hereinbefore described.

The fixture which is supported by the described carriage may also comprise a frame of structural members adapted to support one or more manipulator or tool arm assemblies which may be program or remote controlled to perform a variety of operations associated with handling and/or assembly or machine operations relative to the work. These operations may include such functions as picking up and transporting different units of work to a conveyor or carrier, picking up and manipulating different units of work to predeterminately position them with respect to each other or a further assembly for the purpose of assembling said units together or to said further assembly, picking up and positioning one or more units of work and one or more fasteners for assembly operations to be performed by the manipulator, manipulating a tool such as a welding tool with respect to a unit of work which is supported by a handling device of the manipulator wherein the welding tool is also supported by another holding device thereof, simultaneously performing a plurality of operations on one or more units of work by different heads of the manipulator such as simultaneous welding operations, welding and assembly operations, drilling or other machining operations, simultaneous machining and inspection operations, simultaneous machining and fluid direction operations such as the application of a coolant, cutting fluid, blast of gas, heating means, or other device for cooperating with the tool supported by the same manipulator as it operates on the work. Such other device may include manipulating and supply devices for fasteners, welding rods, adhesives, deburring devices, inspection and finishing devices.

IV. For operations which involve the application of the manipulator or one of its handling fixtures in predeterminately dispensing a material with respect to the work such as fasteners, welding material, finishing material, coating or covering material, or other articles to be assembled automatically thereby, a supply of such material may be predeterminately located with respect to the manipulator or supported within the realm of its operation in such a manner that it is accessible to the manipulator and the manipulator may be either controlled remotely by an operator at a console by the means described or automatically under the control of a programming means such as described or a modified form thereof.

In one form of modified control system wherein an automatic manipulator of the type hereinbefore described is required to automatically travel to a source of supply of material, a homing system may be utilized wherein either the manipulator contains a source of radiation which is directed in the general vicinity of the source of supply of the material and is reflected therefrom to the manipulator and utilized to guide the manipulator towards said source of material such that it may be automatically operated or remotely controlled when at said source to obtain a new supply of such material or radiation generating means may be located at said source of material which may generate radiation towards which the manipulator may home to bring it into operative relation therewith whereafter the manipulator may be automatically or remotely controlled to receive and replenish such material within a storage means or reservoir supported by the manipulator head or the carriage therefor. Such material to be used by the manipulator during its operation on work disposed adjacent to the manipulator may be transferred to the manipulator head through a conduit extending through the manipulator elements or may be picked up by the manipulator head when it is automatically or remotely controlled to move the reservoir or storage means therefor and to seize or otherwise retain the material thereby.

In FIG. 9 is shown a self-propelled manipulator 110 moveable on a tractor carriage base 111 provided with at least two endless belt cleat or flight traction units 113 which are respectively driven around powered sprocket wheels 114 and 115 supported by a box shaped frame 112. Centrally disposed and supported by the frame 112 is an upstanding column or fixture 115 and rotatable about the column on frame 112 or an extension thereof is a turret 127 containing a plurality of receptacles 128 for respective tools 125 which will be described.

Moveable up and down on the vertical fixture or columns 115 is a manipulator assembly 116 which includes a carriage 117 which is power driven up and down column 115 by means of a reversible gear motor 117M, the mechanism therefor being more fully described in my co-pending U.S. patent application Ser. No. 638,432 entitled TOOL AND MATERIAL MANIPULATION APPARATUS AND METHOD now U.S. Pat. No. 4,636,137.

Supported by carriage 117 and extending laterally from one side thereof is a first arm or fixture 118 which is movable laterally from the fixture in a direction normal to the longitudinal axis of column or fixture 115. The arm 118 rotatably supports a second arm 119 for rotation about its longitudinal axis and a reversible gear motor (not shown) is supported within arm 118 for rotating arm 119 in either a clockwise or counterclockwise direction. Pivotally supported on a Joint 120 at the end of arm 119 is a third arm 121 which is rotated about the axis of Joint 120 by means of another reversible gear motor, (also not shown), and pivotally supported for rotation about a second pivotal joint 122 is a fixture 123 which rotatably supports a working or operating head 124 containing means for receiving, retaining and releasing a plurality of different tools 125 in FIG. 9 and also comprising tools 125A–125F supported by turret 127.

Tool 125 is illustrated as secured to the end of working head 124 and shown as a motorized quill which contains motors therein for longitudinally moving a powered drill unit 126 and rotating the drill bit thereof for drilling holes through or into work disposed in alignment with the working or operating head. However, other tool units 125A, 125B, 125E and 125F are supported by turret 127 and include other motorized machining tools, welding tools, fastening or riveting tools, other drill units, and a variety of article handling devices such as motorized jaws, grippers or other devices capable of being rapidly secured to or removed from a suitable receptacle portion of tool head 124 by properly prepositioning said tool head and/or turret 127 to bring the end of tool head 124 into axial alignment with a selected releasable tool retaining fixture 128 of turret 127.

FIG. 10B shows details of a typical tool 125 and the retaining fixture therefor which is supported by turret 127. The tool is illustrated as a drill quill having a housing 125S, the major portion of which is cylindrical in shape with the rear end thereof containing a threaded wall or collar 125T adapted to be threadably received by and retained in the threaded inside wall portion of a collar supported at the end of the working head 124 when the working head or threaded fixture thereof is properly power rotated when aligned with and engaging the end of the threaded portion 125T of the tool housing.

Tool housing 125S is shown slidably engaged within the cylindrical bore of a cup-shaped housing having a cylindrical side wall 128A supported by a circumscribing flange 127F extending downwardly and inclined toward the center of turret 127. Side wall 128A contains a longitudinal channel 128C formed in the inside surface thereof for receiving a projection or key portion 125K secured to and protruding outwardly from cylindrical side wall 125S of tool 125. An end wall 128B secured to the end of side wall 128A limits the longitudinal travel of the tool in the cup-shaped retainer and a centrally disposed opening 128D accommodates and permits the tool bit to pass therethrough.

When it is necessary for manipulator 10 to change tools or handling devices supported by its head 124, the motors which power drive carriage 117, arms 118, 119 and 122 at operating head 124 and those motors which either power-rotate vertical extending column 115 on carriage 112 or turret 127 around column 115 are all controllably operated to bring working head 124 into alignment with a selected unoccupied tool holding fixture. Thereafter, one or more of said motors are controlled in their operation to longitudinally move the manipulator head and the tool held thereby to move the tool housing 125S to the position illustrated in FIG. 10B wherein the key or elongated protrusion 125K secured to housing 125S aligns with and passes through channel 128C in the inside surface of cylindrical wall 128A of the retainer for the tool.

When tool housing 125S is so located and prevented from rotating within the cylindrical bore of the retainer by key 125K, a gear motor 124M (FIG. 10A), is secured within housing 124H of the operating head, power-rotates tool retaining collar 124C through its output shaft gear 124MG meshed with a gear 124CG secured to collar 124C and in so doing unscrews threaded end 125T of the tool from the threads of collar 124C.

This operation may be effected by controllably operating one or more motors of the manipulator to longitudinally move the working head 124 and collar 124C to remove the collar from the end of housing 125S while key 125K is frictionally engaged in channel 128C of fixture wall 128A so that tool 125 will not be longitudinally pulled out of the cup-shaped retainer or fixture 128.

A centrally disposed cylindrical extension 125V of housing 125S contains either exposed electrical conductors or a pluggable connector receptable portion 125VR for connecting electrical circuitry including one or more motors locating within housing 125S for driving the power-operated tool handling device. Respective electrical coupling means is supported in a housing 124H containing electrical wires which extend to a source of electrical energy, such as a battery or generator, located either within the housing for carriage 117 or the base carriage 112., Suitable rotary and longitudinal brush-contacing electrical coupling means may be disposed between base carriage 112 and electrical wires located within the column or fixture 115 and manipulator assembly 116 and the various arm elements of the manipulator assembly and operating head 124 so that controlled electrical operation of the tool or manipulator device 125 may be effected.

Once the tool has been removed from the coupling device 124C of operating head 124, another tool may be replaced therein by controlled operation of the various motors described to align coupling device 124C with the end of a selected tool disposed at a selected location on turret 127, whereafter the tool head 124 may be longitudinally moved as motor 124M is properly operated to rotate collar 124C in the act of effecting a turning, screw-like connection between the internal threads of the collar 124C and the external threads 125T at the end of tool housing 125S. Electrical connection between the wires or coupling devices of recepticle 125VR of the extension 125V of the housing 125S is automatically effected when a screw connection is completed by the controlled rotation of the collar 124C onto threads 125T at the end of housing 125S.

To effect the aforedescribed uncoupling of a tool and coupling of a second tool to operating head 124, a programming device or a computer is employed to generate suitable control signals for controlling the various motors as described to perform suitable powered-driving movement of the various fixtures, arms and collar 124C, either with or without the generation of feedback signals, In other words, the controlled operation of the various motors may be effected by means of an open loop system in which a memory is employed to properly control the manipulator arm movements and the operation of turret 127 or a closed loop system in which signals are generated with each degree of movement of the various power-operated devices and are bucked against a comparator such as a summing amplifier for the control of the particular motor to properly operate the device driven thereby for aligning operating head 124 with the selected storage location and effecting controlled operation thereafter to couple and uncouple the selected tools or article handling devices 125 with operating head 124.

FIG. 11 shows a modified form of the apparatus of FIG. 1 comprising an automatic manipulator 130 which may be supported on a stationary or self-propelled mount of the type shown in FIG. 9 and which includes an upstanding fixture or column 131 serving as a vertical guideway for a manipulator assembly 133 which includes a carriage 134 which is power-operated by a reversible gear motor 135 for movement up and down the guideway 131. Further details for the mechanism for power-driving assembly 133 vertically on guideway 131 may be derived from the hereinabove description of FIGS. 2, 3 and 4.

A manipulator arm assembly 139 is supported for longitudinal movement within a fixture 136 and is driven therein away from and toward column 131 by a controlled reversible motor 137 such as lineal actuator secured to carriage 134. Fixture 136 is power rotated to rotate the arm assembly 139 by a reversible gear motor (not shown) secured within the housing of carriage 134, thus permitting reversible rotation and lineal actuation of arm assembly 139 with respect to carriage 134.

Arm assembly 139 includes a first manipulator arm 138 pivotally supporting a second arm 141 at a pivoted joint 140 at the end thereof while a third arm 143 is pivotally supported at the other end of arm 141 by a pivoted joint 142. Each of the arms 141 and 143 is power-rotated by suitable motor and coupling means (not shown) located within the arms 139, 141, and 143. Rotatably supported on a fixture 144 at the end of arm 143 is an operating head 145 containing coupling means of the type illustrated in FIG. 8 for releasably supporting a plurality of different power operating tools or article handling devices as described.

Rotatably supported on the upper end of carriage 134 and power-operated by a reversible gear motor (not shown) thereon is a turret 146 containing a plurality of storage locations each having a separate fixture 147, similar to fixtures 128 of FIGS. 9 and 10B, for releasably retaining tools and article handling devices 125 of the types described. When it is necessary to change the tool held by the operating head 145 and replace it with another tool or article handling device, the gear motor operating turret 146 is automatically controlled to rotate said turret to bring a storage location thereof into alignment with arm assembly 139.

Controlled operating of the motors in driving arms 138, 141 and 143 as well as the motor located within fixture 144 for controllably rotating operating head 145, effects alignment of operating head 145 with a selected storage location of turret 146 after which said motors are controlled to effect removal of the tool from the operating head and its storage at the selected storage location.

Thereafter, the turret driving motor is controlled to bring a storage location of turret 146 containing a selected tool or handling device into alignment with arm assembly 139 and the motors driving arm assembly 139 and operating head 145 are thereafter controllably operated to effect coupling attachment of the selected tool or article handling device with operating head 145 as hereinbefore described. Electrical and/or fluidic coupling of tool or handling device input and output means with electrical or fluidic coupling means associated with the operating head is automatically effected during the coupling operation.

In a modified form of the apparatus illustrated in FIG. 11, turret 146 may be rotatably supported at the upper end of column or fixture 131 and power-rotated by a reversible gear motor secured to the upper end of 131 to bring selected storage locations of the turret into alignment with arm assembly 139 so that an automatic tool changing operating may be effected as described.

Turret 146 may also be fixedly supported on a tube or fixture extending vertically through the center of hollow column or fixture 131 wherein controlled alignment of a storage location of the fixture is effected by controllably rotating column 131 and the manipulator assembly 133 supported thereby to bring the manipulator assembly and operating head 145 into alignment with a selected storage location of turret 146.

FIG. 12 illustrates a modified form of the invention wherein a self-propelled manipulator 150 is operable to perform various operations on work located adjacent thereto such as welding, torch cutting, fastening or riveting, assembly or other operations which involve the use of expendable materials such as welding rod, fasteners, welding flux, etc. and wherein such materials must be supplied to the operating head or a tool supported thereby to effect proper operation thereof.

Manipulator 150 is somewhat similar in construction to that illustrated in FIG. 1 and includes a self-propelled carriage 152 containing endless belts or tracks 153 which are supported for driving movement about respective pairs of sprocket wheels 154 and 155 with at least one sprocket wheel of each of the pairs being power-rotated by a respective motorized drive means. The base or carriage 152 supports a vertical column or fixture 156 which is power-rotated by a respective motorized drive means. The base or carriage 152 supports a vertical column or fixture 156 which is power-rotated thereon by a suitable reversible gear motor (not shown) to rotate a manipulator assembly 168 around the base.

A support or turret 157 is either fixed or power-rotatable at the upper end of carriage 152 and contains, in addition to a plurality of tools 125 and manipulating devices of the types described, one or more reservoirs for expendable material such as welding rod, welding flux, a welding fuel, fasteners, rivets or the like.

In FIG. 12, reservoir 158 is shown as containing a hopper portion or dispensing head 159 from the end of which may be dispensed by gravity or power-operated means when a dispensing device 161, such as a valve or gate, is controllably operated.

Extending outwardly from the manipulator carriage 169 of assembly 168 is a first fixture 170 having means for supporting and rotating a manipulator arm assembly 171 having a first arm 172 pivotally supporting a second arm 174 on a powered joint 173 at the end thereof. Arm 174 pivotally supports a third arm 176 on a powered joint 175 at its end while a power-rotated fixture or operating head 177 is supported at the far end of arm 176. A power-operated tool such as a riveting or welding head 178 is supported by fixture 177 and contains one or more devices 179 protruding therefrom. Device 179 may comprise a riveting tool, screw fastening tool, welding tool, cutting tool or other device which requires a supply of rivets, fasteners, welding rods, flux, cutting liquid or fuel fed thereto from a reservoir or hopper 180 supported by arm 176 at the side thereof. One or more similar reservoirs may also be located within arm 176 or any of the other devices of the manipulator arm assembly 171.

Shown extending downwardly from reservoir 180 is a dispensing head or tube 181, the end of which is located in alignment with the tool 179 for feeding articles or material thereto during the operation of the manipulator in performing one of the described operations on work W aligned therewith. A valve or motorized unit 182 controls the feed of material or fasteners from reservoir 180 to the dispensing device 181. A second motor or solenoid operated device 183 located at the upper end of reservoir 180 controls the flow of material into the reservoir form the dispensing end 159 of reservoir 158.

By controlling (a) the operation of the various motors driving carriage 169, fixture 170, arms 172, 174 and 176 and fixture 177, to position the upper end of reservoir 180 in alignment with the dispensing end or hopper 159 of reservoir 158 and (b) the motors or solenoids defining part of the mechanisms 161 and 183, a predetermined quantity of material or parts located within the reservoir 158 may be transferred to the reservoir 180 when the latter is in a receiving location as illustrated by the broken line notation in FIG. 12.

A lid or cover 165 for reservoir 158 may be opened or moved by a mechanism 166 which may include a controlled reversible gear motor 167. When manipulator 150 is predeterminately located with respect to another reservoir for the desired material, motor 167 may serve to replenish the supply of the material or parts defined by reservoir 158. Thus, if the drive means for the self-propelled carriage 152 is remotely or automatically controlled to bring carriage 152 and reservoir 158 into alignment with another reservoir containing desired parts or material, motor 167 is automatically controlled to open the gate 165 to permit loading of such material or parts into reservoir 158.

I claim:

1. An automatic, moveable manipulator comprising:
   (a) a carriage;
   (b) a power drive coupled to the carriage and positioned to move the carriage in a multitude of directions, comprising two moving members oriented parallel to each other, which may be driven simultaneously and independently in the same or different directions;
   (c) at least one manipulator arm supported at a first end by the carriage and having a tool holder at a second end with an engagement-release mechanism adapted to support one of a plurality of different tools;
   (d) a motor drive coupled to the arm so as to move the arm;
   (e) a scanner supported by the manipulator and positioned to scan the external environment of the manipulator and structured to generate a varying scanning signal;
   (f) a wireless receiver supported by the carriage;
   (g) an electronic storage device supported by the carriage and structured to store signals received from a remote location by the receiver; and
   (h) a controller coupled to reproduce the stored signals from the storage and structured to process the reproduced signals to generate command control signals and to apply the command control signals to control the operation of the manipulator; and
   (i) a computer structured to analyze the generated scanning signal to determine a characteristic of a workpiece in the vicinity of the manipulator, which computer is coupled to the manipulator arm so that the results of the analysis is applied to control the selection of one of the plurality of different tools, the supporting of the selected tool by the tool holder, and the operation of the selected tool.

2. An automatic manipulator and control system therefor comprising:
   (a) at least one manipulator, including:
      i) a carriage;
      ii) drive means for moving the carriage in a multitude of directions along a surface, comprising two moving members oriented parallel to each other, which may be driven simultaneously and independently in the same or different directions;
      iii) a manipulator arm assembly supported by the carriage;
      iv) a tool rack containing a plurality of power-operated tools;
      v) means for removing a selected one of the tools from the tool rack, for electrically and physically connecting the selected tool to the arm assembly, for supporting the selected tool with the arm assembly, for power operating the selected tool while it is supported by the arm assembly, and for controllably releasing tools from the arm assembly;
      vi) motor means for moving the arm assembly through three-dimensional space;
      vii) means on the manipulator for receiving command signals;
      viii) means on the manipulator for storing a plurality of command control signals;
      ix) means for reproducing a selected group of signals from the storage means, for generating the reproduced signals as a sequence of commands, and for applying the commands to control the movement and operation of the manipulator; and
      x) means for electro-optically sensing a field of view adjacent to the manipulator and for generating output signals that vary in accordance with optical variations in the sensed field of view;
      xi) signal processing means for digitizing the output signal from the sensing means, for computer analyzing the digitized signals, and for using the results of the analysis to modify the operation of the tool selection and operation means by selecting one of a plurality of control programs; and
   (b) a remote computer, including:
      i) means for storing a plurality of control programs as signals controlling the manipulator to cause it to perform a preselected sequence of operations involving the programmed operation of the drive means, the motor means, and the coupling means;
      ii) means for selectively reproducing the control programs from the storage means; and
      iii) means for transmitting trains of signals defining the selected control programs to the receiving means of the manipulator.

3. A moveable manipulator comprising:
   (a) a carriage;
   (b) a power drive coupled to the carriage and positioned to move the carriage in a multitude of directions, comprising two moving members oriented parallel to each other, which may be driven simultaneously and independently in the same or different directions;
   (c) at least one arm assembly supported by the carriage, which arm assembly supports one of a plurality of tools;
   (d) a motor drive coupled to and driving the arm assembly;
   (e) an electronic storage device containing a plurality of control programs, each comprising a sequence of command signals;
   (f) a reproduction transducer coupled to the storage device and structured to reproduce a selected one of the control programs from the storage device as command control signals and coupled to apply the sequence of command signals to control the operation of the manipulator and to select one of the tools;
   (g) a video scanner supported by the manipulator and having an output for video signals that vary in accordance with a visual characteristic of the external environment of the manipulator; and
   (h) a signal processor coupled to the output of the video scanner and the reproduction transducer and structured to identify a workpiece adjacent to the manipulator from the video signals on the scanner output and to use the results of the identification to select one of the plurality of control programs to cause the manipulator to perform a tooling operation on the identified workpiece using the selected tool.

4. An apparatus in accordance with claim 3 wherein the reproduction transducer is coupled to apply the selected program to cause the arm assembly to swap among a plurality of the tools to perform a predetermined operation on the workpiece.

5. An apparatus in accordance with claim 3 wherein the signal processor is structured to identify the type of workpiece adjacent to the manipulator and to use the results of the identification to select one of the programs to control the manipulator.

6. An apparatus in accordance with claim 5 including a sensor positioned to detect the presence of a workpiece adjacent to the manipulator, which sensor is coupled to cause the selected control program to operate the manipulator in a predetermined manner upon activation of the sensor.

7. An apparatus in accordance with claim 5 wherein the signal processor further comprises a sensor positioned to detect a workpiece at a predetermined location relative to the manipulator, which sensor is coupled to cause reproduction and application of the selected control program to cause the manipulator to operate on the workpiece.

8. An apparatus in accordance with claim 3 wherein the signal processor includes an identification subsystem structured to analyze digitized video signals from the output to identify a select object and to generate select control signals, and coupled to the power drive to cause it to move the carriage in a predetermined manner with respect to the object based on the identification.

9. An apparatus in accordance with claim 8 wherein the identification subsystem is further coupled to controllably pick up and move the object in a predetermined manner based on the identification.

10. An apparatus in accordance with claim 3 wherein the signal processor includes an identification subsystem structured to analyze digitized video signals from the output to identify a select object and to generate select control signals, and coupled to the arm assembly to cause it to operate on the object in a predetermined manner based on the identification.

11. A process of controlling an moveable manipulator having a moveable base, at least one multi-part arm assembly supported by the base and capable of holding a tool, and motors coupled to move the arm in 3D space comprising:

(a) storing at the manipulator a plurality of control programs, each comprising a sequence of command signals;

(b) reproducing a selected one of the control programs as command control signals and applying the command signals to control the movement of the arm, the selection of one of a plurality of interchangeable tools, and the operation of the selected tool;

(c) generating at the manipulator video signals that vary in accordance with a visual characteristic of the external environment of the manipulator;

(d) digitizing the video signals;

(e) computer analyzing the digitized signals to identify a workpiece sensed adjacent to the manipulator;

(f) using the results of the identification to select one of a plurality of the control programs;

(g) applying the selected program to cause the base to move in any direction in two dimensions by simultaneously and independently driving two moving members oriented parallel to each other in the same or different directions; and (h) applying the selected program to cause the manipulator to perform a tooling operation on the identified workpiece using the selected tool.

12. The process of claim 11 further comprising applying the selected program to cause the arm assembly to select and operate several of a plurality of tools to perform a predetermined operation on the workpiece.

13. The process of claim 12 further comprising applying the selected program to cause the arm assembly to sequentially support and release each of the selected tools to perform sequential operations on the workpiece.

14. The process of claim 11 further comprising identifying the type of workpiece adjacent to the manipulator and using the results of the identification to select one of the programs to control the manipulator.

15. The process of claim 14 including detecting the presence of a workpiece adjacent to the manipulator and applying the selected control program to operate the manipulator upon the detection to cause the manipulator to handle the workpiece in a predetermined manner.

16. The process of claim 14 wherein further comprising detecting a workpiece at a predetermined location relative to the manipulator and thereupon reproducing and using the selected program to cause the manipulator to operate on the workpiece.

17. The process of claim 11 further comprising identifying a select object by analyzing the digitized scanning signals, generating select control signals based on the identification, and applying the select control signals to move the carriage in a predetermined manner with respect to the object based on the identification.

18. The process of claim 17 including controllably picking up and moving the object in a predetermined manner based on the identification.

19. The apparatus of claim 1 wherein the scanner comprises a television camera having an output for video signals generated thereby.

20. The apparatus of claim 3 wherein the video scanner comprises a television camera.

21. The apparatus of claim 1 further comprising (a) an electrical coupling through the arm and the tool holder including a power line extending to the selected, supported one of the tools; and (b) a tool rack supported by the carriage and containing a plurality of power-operated tools configured to be electrically and physically connected to the tool holder.

22. The apparatus of claim 3:

(a) wherein the arm assembly includes a tool holder having an engagement-release mechanism configured to support a single one of a plurality of tools on the arm assembly and an electrical coupling through the arm including a power line extending to the selected, supported one of the tools;

(b) wherein the manipulator further comprises a tool rack containing a plurality of power-operated tools configured to be electrically and physically connected to the tool holder; and (c) further comprising a wireless receiver supported by the carriage and coupled to the storage device.

23. The apparatus of claim 1 wherein the power drive comprises a pair of moving belt members oriented parallel to each other and a reversible-gear motor coupled to and separately driving each of the belt members.

24. The apparatus of claim 23 wherein the two belt members are cleated.

25. The apparatus of claim 1 further comprising a column supported on the carriage, wherein the arm is supported on and moveable along the column, and wherein the motor drive includes a first motor positioned to drive the arm along the column, a second motor positioned to rotate the arm around the column, and a third motor positioned to extend the arm orthogonal to the column.

26. The apparatus of claim 21 further comprising a column supported on the carriage, wherein the arm is supported on and moveable along the column, wherein the arm is hinged, wherein the tool rack is supported on top of the column, and wherein the motor drive includes a first motor positioned to drive the arm along the column, a second motor positioned to rotate the arm around the column, and a third motor positioned to bend the arm at the hinge.

27. The apparatus of claim 21 wherein the engagement-release mechanism comprises a rotatable, threaded sleeve at the end of the arm and a reversible motor coupled to rotate the sleeve.

28. The apparatus of claim 1 further comprising a stabilizer positioned to counterbalance a load supported by the arm, including a retractable extension positioned to stabilize the manipulator by bracing the manipulator against a stable surface.

29. The apparatus of claim 3 wherein the power drive comprises a pair of moving belt members oriented parallel to each other and a reversible-gear motor coupled to and separately driving each of the belt members.

30. The apparatus of claim 29 wherein the two belt members are cleated.

31. The apparatus of claim 3 wherein the arm assembly comprises a column supported on the carriage and an extendable shaft supported on and moveable along the column, and wherein the motor drive includes a first motor positioned to drive the shaft along the column, a second motor positioned to rotate the shaft around the column, and a third motor positioned to extend the shaft orthogonal to the column.

32. The apparatus of claim 22 wherein the arm assembly comprises a column supported on the carriage and a hinged shaft supported on and moveable along the column, wherein the tool rack is supported on top of the column, and wherein the motor drive includes a first motor positioned to drive the shaft along the column, a second motor positioned to rotate the shaft around the column, and a third motor positioned to bend the shaft at the hinge.

33. The apparatus of claim 22 wherein the engagement-release mechanism comprises a rotatable, threaded sleeve at the end of the arm assembly and a reversible motor coupled to rotate the sleeve.

34. The apparatus of claim 3 further comprising a stabilizer positioned to counterbalance a load supported by the arm assembly, including a retractable extension positioned to stabilize the manipulator by bracing the manipulator against a stable surface.

* * * * *